(12) United States Patent
Yang et al.

(10) Patent No.: US 7,375,947 B2
(45) Date of Patent: May 20, 2008

(54) METHOD OF FEEDBACK CONTROL OF ESC VOLTAGE USING WAFER VOLTAGE MEASUREMENT AT THE BIAS SUPPLY OUTPUT

(75) Inventors: Jang Gyoo Yang, Sunnyvale, CA (US); Daniel J. Hoffman, Saratoga, CA (US); Steven C. Shannon, San Mateo, CA (US); Douglas H. Burns, Saratoga, CA (US); Wonseok Lee, Pleasanton, CA (US); Kwang-Soo Kim, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/672,362

(22) Filed: Feb. 7, 2007

(65) Prior Publication Data
US 2007/0127188 A1   Jun. 7, 2007

Related U.S. Application Data

(62) Division of application No. 11/127,036, filed on May 10, 2005.

(51) Int. Cl.
*H01L 21/283* (2006.01)
*B23B 31/28* (2006.01)

(52) U.S. Cl. .................. 361/234; 361/233; 279/128; 216/67; 216/69

(58) Field of Classification Search ............. 361/234, 361/233; 279/128; 216/67
See application file for complete search history.

(56) References Cited

U.S. PATENT DOCUMENTS

| | | | |
|---|---|---|---|
| 2,951,960 A | 9/1960 | Watrous, Jr. ............. | 313/36 |
| 2,967,926 A | 1/1961 | Edstrom .................. | 219/75 |
| 3,355,615 A | 11/1967 | Bihan et al. ............. | 313/63 |
| 3,610,986 A | 10/1971 | King ...................... | 313/63 |
| 4,458,180 A | 7/1984 | Sohval ................... | 315/111.81 |
| 4,464,223 A * | 8/1984 | Gorin ..................... | 438/729 |
| 4,570,106 A | 2/1986 | Sohval et al. ........... | 315/111.81 |
| 4,579,618 A | 4/1986 | Celestino et al. ........ | 156/345 |
| 4,859,908 A | 8/1989 | Yoshida et al. .......... | 315/111.81 |
| 4,888,518 A | 12/1989 | Grunwald ................ | 313/40 |
| 4,973,883 A | 11/1990 | Hirose et al. ............ | 315/111.41 |
| 4,990,229 A | 2/1991 | Campbell et al. ........ | 204/298.06 |
| 5,006,760 A | 4/1991 | Drake, Jr. ............... | 315/111.21 |
| 5,017,835 A | 5/1991 | Oechsner ................ | 315/111.81 |

(Continued)

FOREIGN PATENT DOCUMENTS

EP     0 343 500 A1    11/1989

(Continued)

OTHER PUBLICATIONS

King, Ronald W.P., "Transmission-Line Theory", Dover Publications, Inc., 1965, New York, pp. 1-10 and 282-286.

*Primary Examiner*—Michael Sherry
*Assistant Examiner*—Zeev Kitov
(74) *Attorney, Agent, or Firm*—Robert M. Wallace

(57) ABSTRACT

In a plasma reactor having an electrostatic chuck, wafer voltage is determined from RF measurements at the bias input using previously determined constants based upon transmission line properties of the bias input, and this wafer voltage is used to accurately control the DC wafer clamping voltage.

16 Claims, 14 Drawing Sheets

U.S. PATENT DOCUMENTS

| | | | | |
|---|---|---|---|---|
| 5,032,202 | A | 7/1991 | Tsai et al. | 156/345 |
| 5,053,678 | A | 10/1991 | Koike et al. | 315/111.81 |
| 5,055,853 | A | 10/1991 | Garnier | 343/769 |
| 5,077,499 | A | 12/1991 | Oku | 315/111.21 |
| 5,089,083 | A | 2/1992 | Kojima et al. | 156/643 |
| 5,107,170 | A | 4/1992 | Ishikawa et al. | 313/362.1 |
| 5,115,167 | A | 5/1992 | Ootera et al. | 315/111.21 |
| 5,122,251 | A | 6/1992 | Campbell et al. | 204/298.06 |
| 5,140,223 | A | 8/1992 | Gesche et al. | 315/111.21 |
| 5,175,472 | A * | 12/1992 | Johnson et al. | 315/111.21 |
| 5,195,045 | A | 3/1993 | Keane et al. | 364/482 |
| 5,198,725 | A | 3/1993 | Chen et al. | 315/111.41 |
| 5,210,466 | A | 5/1993 | Collins et al. | 315/111.21 |
| 5,213,658 | A | 5/1993 | Ishida | 156/643 |
| 5,218,271 | A | 6/1993 | Egorov et al. | 315/111.61 |
| 5,223,457 | A | 6/1993 | Mintz et al. | 437/225 |
| 5,225,024 | A | 7/1993 | Hanley et al. | 156/345 |
| 5,246,532 | A | 9/1993 | Ishida | 156/345 |
| 5,256,931 | A | 10/1993 | Bernadet | 313/360.1 |
| 5,272,417 | A | 12/1993 | Ohmi | 315/111.21 |
| 5,273,610 | A | 12/1993 | Thomas, III et al. | 156/62.7 |
| 5,274,306 | A | 12/1993 | Kaufman et al. | 315/111.41 |
| 5,279,669 | A | 1/1994 | Lee | 118/723 |
| 5,280,219 | A | 1/1994 | Ghanbari | 315/111.41 |
| 5,300,460 | A | 4/1994 | Collins et al. | 437/225 |
| 5,314,603 | A | 5/1994 | Sugiyama et al. | 204/298.32 |
| 5,325,019 | A | 6/1994 | Miller et al. | 315/111.21 |
| 5,401,351 | A | 3/1995 | Samukawa | 156/345 |
| 5,432,315 | A | 7/1995 | Kaji et al. | 219/121.43 |
| 5,453,305 | A | 9/1995 | Lee | 427/562 |
| 5,463,525 | A | 10/1995 | Barnes et al. | 361/234 |
| 5,467,013 | A | 11/1995 | Williams et al. | 324/127 |
| 5,474,648 | A | 12/1995 | Patrick et al. | 156/627.1 |
| 5,512,130 | A | 4/1996 | Barna et al. | 156/651.1 |
| 5,534,070 | A | 7/1996 | Okamura et al. | 118/723 |
| 5,537,004 | A | 7/1996 | Imahashi et al. | 315/111.21 |
| 5,554,223 | A | 9/1996 | Imahashi | 118/723 |
| 5,556,549 | A | 9/1996 | Patrick et al. | 216/61 |
| 5,567,268 | A | 10/1996 | Kadomura | 156/345 |
| 5,576,600 | A | 11/1996 | McCrary et al. | 315/111.81 |
| 5,576,629 | A | 11/1996 | Turner et al. | 324/709 |
| 5,587,038 | A | 12/1996 | Cecchi et al. | 156/345 |
| 5,592,055 | A | 1/1997 | Capacci et al. | 315/111.21 |
| 5,595,627 | A | 1/1997 | Inazawa et al. | 156/643.1 |
| 5,605,637 | A | 2/1997 | Shan et al. | 216/71 |
| 5,618,382 | A | 4/1997 | Mintz et al. | 216/64 |
| 5,627,435 | A | 5/1997 | Jansen et al. | 315/111.21 |
| 5,660,671 | A | 8/1997 | Harada et al. | 156/345 |
| 5,662,770 | A | 9/1997 | Donohoe | 438/716 |
| 5,674,321 | A | 10/1997 | Pu et al. | 118/723 |
| 5,685,914 | A | 11/1997 | Hills et al. | 118/723 |
| 5,705,019 | A | 1/1998 | Yamada et al. | 156/345 |
| 5,707,486 | A | 1/1998 | Collins | 156/643.1 |
| 5,710,486 | A | 1/1998 | Ye et al. | 315/111.21 |
| 5,720,826 | A | 2/1998 | Hayashi et al. | 136/249 |
| 5,733,511 | A | 3/1998 | De Francesco | 422/186.05 |
| 5,770,922 | A | 6/1998 | Gerrish et al. | 315/111.21 |
| 5,792,376 | A | 8/1998 | Kanai et al. | 216/71 |
| 5,846,885 | A | 12/1998 | Kamata et al. | 438/729 |
| 5,849,136 | A | 12/1998 | Mintz et al. | 156/345 |
| 5,849,372 | A | 12/1998 | Annaratone et al. | 427/569 |
| 5,855,685 | A | 1/1999 | Tobe et al. | 118/723 |
| 5,858,819 | A | 1/1999 | Miyasaka | 438/149 |
| 5,863,376 | A | 1/1999 | Wicker et al. | 156/345 |
| 5,866,986 | A | 2/1999 | Pennington | 315/111.21 |
| 5,868,848 | A | 2/1999 | Tsukamoto | 118/723 |
| 5,885,358 | A | 3/1999 | Maydan et al. | 118/723 |
| 5,904,799 | A | 5/1999 | Donohoe | 156/345 |
| 5,914,568 | A | 6/1999 | Nonaka | 315/111.21 |
| 5,929,717 | A | 7/1999 | Richardson et al. | 333/17.3 |
| 5,936,481 | A | 8/1999 | Fiji | 333/17.3 |
| 5,939,886 | A | 8/1999 | Turner et al. | 324/464 |
| 5,942,074 | A | 8/1999 | Lenz et al. | 156/345 |
| 5,971,591 | A * | 10/1999 | Vona et al. | 700/220 |
| 5,997,962 | A | 12/1999 | Ogasawara et al. | 427/535 |
| 6,016,131 | A | 1/2000 | Sato et al. | 343/895 |
| 6,043,608 | A | 3/2000 | Samukawa et al. | 315/111.51 |
| 6,089,182 | A | 7/2000 | Hama | 118/723 |
| 6,093,457 | A | 7/2000 | Okumura et al. | 427/569 |
| 6,095,084 | A | 8/2000 | Shamouilian et al. | 118/723 E |
| 6,096,160 | A | 8/2000 | Kadomura | 156/345 |
| 6,106,663 | A | 8/2000 | Kuthi et al. | 156/345 |
| 6,110,395 | A | 8/2000 | Gibson, Jr. | 216/67 |
| 6,113,731 | A | 9/2000 | Shan et al. | 156/345 |
| 6,142,096 | A | 11/2000 | Sakai et al. | 118/723 |
| 6,152,071 | A | 11/2000 | Akiyama et al. | 118/723 |
| 6,155,200 | A | 12/2000 | Horijke et al. | 118/723 |
| 6,162,709 | B1 | 12/2000 | Raoux et al. | 438/513 |
| 6,174,450 | B1 | 1/2001 | Patrick et al. | 216/67 |
| 6,188,564 | B1 | 2/2001 | Hao | 361/234 |
| 6,213,050 | B1 | 4/2001 | Liu et al. | 118/723 |
| 6,218,312 | B1 | 4/2001 | Collins et al. | 438/723 |
| 6,245,190 | B1 | 6/2001 | Masuda et al. | 156/345 |
| 6,251,216 | B1 | 6/2001 | Okamura et al. | 156/345 |
| 6,262,538 | B1 | 7/2001 | Keller | 315/111.21 |
| 6,290,806 | B1 | 9/2001 | Donohoe | 156/345 |
| 6,291,999 | B1 | 9/2001 | Nishimori et al. | 324/464 |
| 6,337,292 | B1 | 1/2002 | Kim et al. | 438/787 |
| 6,346,915 | B1 | 2/2002 | Okumura et al. | 343/701 |
| RE37,580 | E | 3/2002 | Barnes et al. | 361/234 |
| 6,449,568 | B1 | 9/2002 | Gerrish | 702/60 |
| 6,451,703 | B1 | 9/2002 | Liu et al. | 438/710 |
| 6,462,481 | B1 | 10/2002 | Holland et al. | 315/111.21 |
| 6,528,751 | B1 | 3/2003 | Hoffman et al. | 219/121.43 |
| 6,586,886 | B1 | 7/2003 | Katz et al. | 315/111.21 |
| 6,652,712 | B2 | 11/2003 | Wang et al. | 156/345.48 |
| 6,727,655 | B2 * | 4/2004 | McChesney et al. | 315/111.21 |
| 6,894,245 | B2 | 5/2005 | Hoffman et al. | 219/121.43 |
| 2002/0108933 | A1 | 8/2002 | Hoffman et al. | 219/121.43 |
| 2002/0139477 | A1 | 10/2002 | Ni et al. | 156/345.44 |
| 2003/0132195 | A1 | 7/2003 | Edamura et al. | 216/59 |
| 2003/0168427 | A1 | 9/2003 | Flamm et al. | 216/2 |

FOREIGN PATENT DOCUMENTS

| | | |
|---|---|---|
| EP | 0 678 903 | 10/1995 |
| EP | 0 719 447 | 7/1998 |
| WO | WO 01/71765 | 9/2001 |

* cited by examiner

METHOD OF FEEDBACK CONTROL OF ESC VOLTAGE USING WAFER VOLTAGE MEASUREMENT AT THE BIAS SUPPLY OUTPUT

CROSS-REFERENCE TO RELATED APPLICATIONS

This application is a divisional of U.S. patent application Ser. No. 11/127,036, filed May 10, 2005 entitled DUAL BIAS FREQUENCY WITH FEEDBACK CONTROL OF E.S.C. VOLTAGE USING WAFER VOLTAGE MEASUREMENT AT THE BIAS SUPPLY OUTPUT by Jang Gyoo Yang, et al. and assigned to the present assignee.

BACKGROUND OF THE INVENTION

A plasma reactor for processing a semiconductor wafer typically holds the wafer inside the reactor chamber using an electrostatic chuck (ESC). Plasma ion energy at the wafer surface is controlled by applying a bias voltage to the wafer through the ESC. The ESC essentially consists of an insulator layer having a top surface for supporting the wafer. An electrode or conductive mesh inside the insulator layer beneath the wafer receives a D.C. voltage, creating a voltage drop across the insulator layer between the electrode and the wafer, which produces an electrostatic force clamping the wafer to the ESC. The clamping force is determined by the difference between the time-average of the wafer voltage and the D.C. voltage applied to the ESC electrode. The clamping voltage must be accurately controlled (by accurately controlling the D.C. supply voltage) in order to avoid an insufficient clamping voltage or an excessive clamping voltage. An insufficient clamping voltage would allow the wafer to pop off of the ESC. An excessive clamping voltage would increase the current through the wafer to a level that risks damaging the circuit features formed on the wafer surface. (Current flows from the ESC electrode through the dielectric layer to the wafer and returns through the plasma in the chamber. The stronger the clamping force, the greater the conductivity between the wafer and the ESC, and therefore the greater the current through the wafer.) In order to accurately control the clamping voltage, the wafer D.C. voltage must be measured accurately. An error in wafer voltage measurement may lead to wafer pop off or to excessive ESC-wafer current.

Use of ESC-wafer contact to control the wafer temperature imposes even more stringent requirements for accurate control of clamping voltage. As disclosed in co-pending U.S. patent application Ser. No. 10/929,104, filed Aug. 26, 2004 entitled, "Gasless High Voltage High Contact Force Wafer Contact-Cooling Electrostatic Chuck," by Douglas Buchberger, Jr. et al., and assigned to the present assignee, the ESC may be heated or cooled so that the wafer is either heated or cooled at a rate determined by the ESC clamping force. The wafer temperature may therefore be accurately set and controlled as desired. In fact, the heat transfer rate is so great as the clamping voltage is increased, that the wafer temperature may be maintained under much higher heat load than was formerly possible. Thus, for example, the wafer bias power may be increased beyond previously permitted levels. However, the wafer temperature range is limited because the clamping voltage cannot closely approach the upper limit (above which the wafer current is excessive) or the lower limit (below which the wafer may pop off the ESC), without more accurate determination of wafer voltage. (The clamping voltage is determined from the difference between the time average of the wafer voltage and the D.C. supply voltage.) Current methods for estimating wafer voltage tend to be inaccurate, so that the clamping voltage range must be limited to ensure that wafer voltage measurement errors do not cause the clamping voltage to violate the upper and lower limits.

An accurate method for determining wafer voltage is disclosed in co-pending U.S. patent application Ser. No. 10/440,364, filed May 16, 2003 by Daniel Hoffman and assigned to the present assignee. This method is applicable to a plasma reactor in which bias power of a single bias frequency only is coupled to the wafer from the ESC. This method is inaccurate when more than one bias frequency is present. For example, the reactor may apply bias power having a low frequency (LF) component and a high frequency (HF) component in order to obtain a favorable ion energy distribution for a plasma process such as plasma enhance reactive ion etching. A large error in wafer voltage measurement occurs when such a dual frequency bias is employed. We have found that the error in the wafer voltage measurement in such a case can create a clamping voltage error exceeding the capacity of the ESC's D.C. voltage supply.

What is needed is an accurate way of measuring wafer voltage with a dual frequency bias. This would permit the clamping voltage to be set to values closer either the maximum or minimum allowed clamping voltage without fear of violating these limits due to wafer voltage measurement errors. This in turn permits the wafer temperature range to be expanded accordingly, a significant advantage.

SUMMARY OF THE INVENTION

In a plasma reactor having an electrostatic chuck (ESC) supporting a wafer to be processed, a method of processing the wafer while controlling an ESC clamping voltage includes applying RF bias power to the ESC from a bias power source at an input to the ESC and applying a D.C. voltage at the input to the ESC from a D.C. voltage source. The voltage and current is measured near the input to produce a measured voltage and a measured current. A wafer voltage signal is provided as a sum of the measured voltage and the measured current multiplied by first and second coefficients respectively, the wafer voltage signal representing the voltage on a wafer supported on the ESC. The method further includes computing a wafer clamping voltage as a difference between a D.C. component of the wafer voltage signal and the D.C. voltage from the D.C. voltage source, and controlling the D.C. voltage to regulate the wafer clamping voltage. In one embodiment, controlling the D.C. voltage is performed so as to minimize a difference between the wafer clamping voltage and a target clamping voltage.

DETAILED DESCRIPTION OF THE INVENTION

Figure 1A:
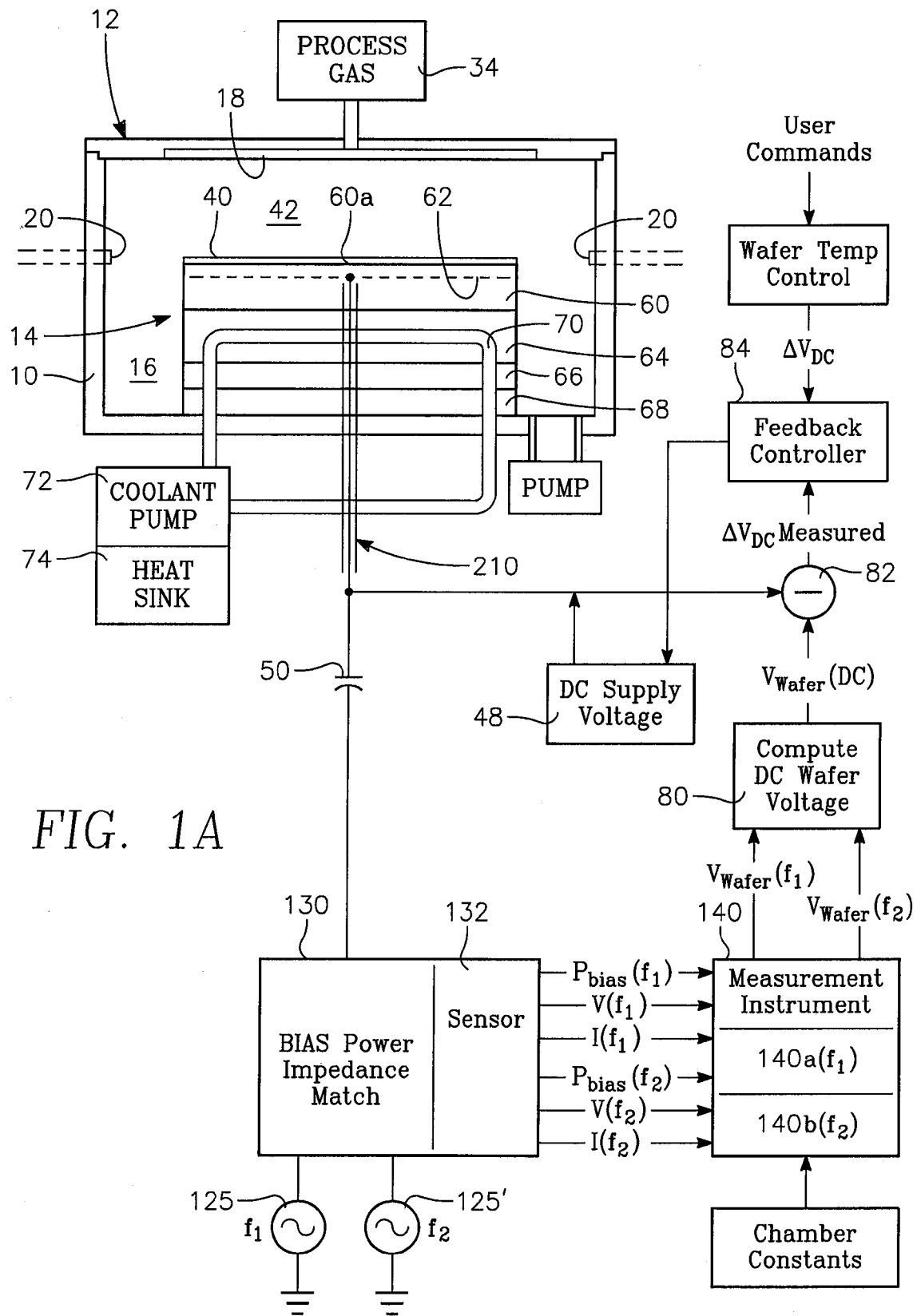
FIG. 1A illustrates a plasma reactor with a measurement instrument in an electrostatic chuck feedback control loop, the reactor having a bias voltage source with a low frequency (LF) component and a high frequency (HF) component.

ESC With High Contact Force Wafer Cooling:

FIG. 1A illustrates a plasma reactor having a cylindrical side wall 10, a ceiling 12 and a wafer contact-cooling electrostatic chuck (ESC) 14. A pumping annulus 16 is defined between the chuck 14 and the sidewall 10. While the wafer contact-cooling electrostatic chuck 14 may be used in any type of plasma reactor or other reactor (such as thermal process reactor), the reactor in the example of FIG. 1A is of the type in which process gases can be introduced through a gas distribution plate 18 (or "showerhead") forming a large portion of the ceiling 12. Alternatively, the reactor could have gas distribution inlets 20 (dashed lines) that are separate from the ceiling 12. While the wafer contact-cooling electrostatic chuck 14 may be employed in conjunction with any plasma source (not illustrated in the drawing), such as an inductively coupled RF plasma source, a capacitively coupled RF plasma source or a microwave plasma source, or a torroidal plasma source. A process gas supply 34 is coupled to the gas distribution plate 18 (or to the gas injectors 20). A semiconductor wafer or workpiece 40 is placed on top of the chuck 14. A processing region 42 is defined between the wafer 40 and the ceiling 12 (including the gas distribution plate 18).

Plasma RF bias power from a low frequency RF bias power generator 125 and from a high frequency RF bias power generator 125' is applied through an impedance match circuit 130 to the wafer support pedestal 14. A D.C. chucking voltage is applied to the chuck 14 from a chucking voltage source 48 isolated from the RF bias power generator 125 by an isolation capacitor 50. The RF power delivered to the wafer 40 from the RF bias power generators 125, 125' can heat the wafer 40 to temperatures beyond 400 degrees C., depending upon the level and duration of the applied RF plasma bias power. It is believed that about 80% or more of the RF power is dissipated as heat in the wafer 40.

Figure 2:
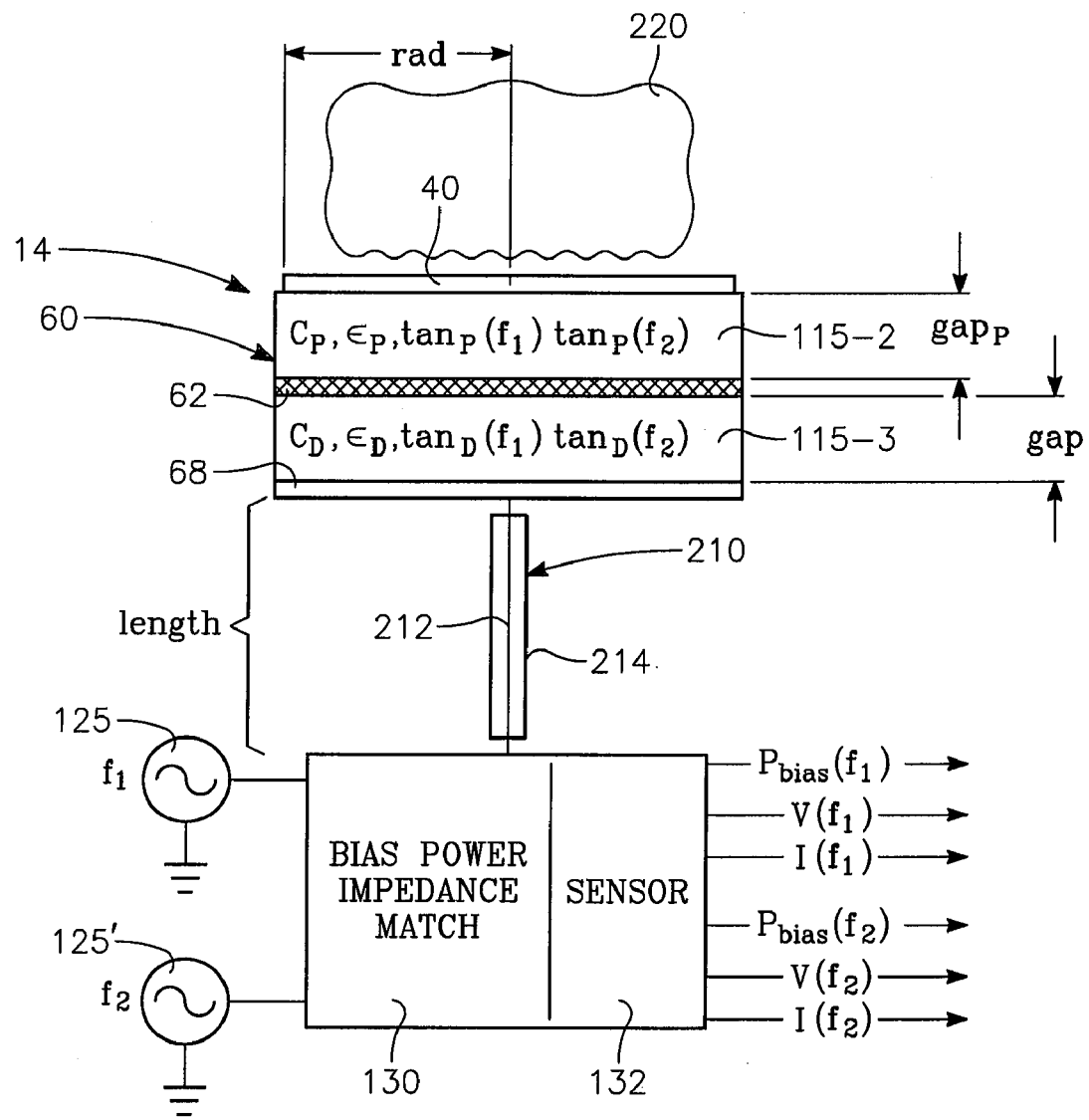
FIG. 2 illustrates an electrical model of the plasma reactor employed by the measurement instrument.

The electrostatic chuck 14 of FIG. 2 is a wafer contact-cooling electrostatic chuck in which the portion of the chuck contacting the wafer is cooled. The wafer contact-cooling electrostatic chuck 14 requires no gas cooling source nor internal gas coolant passages to keep the wafer cool and remove heat from the wafer (although such a feature may be included nevertheless). Instead, the heat is removed from the wafer at a rate which limits the maximum wafer temperature or the time rate of rise of the wafer temperature during plasma processing, by cooling the chuck 14 itself while maintaining direct high-force contact between the wafer 40 and the chuck 14, as will now be described. Alternatively, the chucking voltage may be varied during wafer processing to vary the selected heat transfer coefficient in order to control wafer temperature to a target value. This latter feature may be carried out by monitoring the wafer temperature and varying the chuck voltage so as to minimize the difference between the measured wafer temperature and a target temperature. As the measured wafer temperature rises above a maximum target temperature, the chucking voltage is increased, and as the measured wafer temperature falls below a target minimum temperature, the chucking voltage may be decreased. Moreover, the high-force contact cooling of the wafer is able to control wafer temperature even at very high RF bias power levels.

The chuck 14 has a top layer 60, referred to as a puck, consisting of insulative or semi-insulative material, such as aluminum nitride or aluminum oxide, which may be doped with other materials to control its electrical and thermal properties. A metal (molybdenum, for example) wire mesh or metal layer 62 inside of the puck 60 forms a cathode (or electrode) to which the chucking voltage and RF bias power is applied via a coaxial cable 210. The puck 60 may be formed as a ceramic. Or, it may be formed by plasma or physical deposition processes, or chemical vapor deposition process or plasma or flame spray coating or other method. It is supported on a metal layer 64, preferably consisting of a metal having a high thermal conductivity, such as aluminum. The metal layer 64 rests on a highly insulative layer 66 whose thickness, dielectric constant and dielectric loss tangent are chosen to provide the chuck 14 with selected RF characteristics (e.g., capacitance, loss resistance) compatible with the reactor design and process requirements. A metal base layer 68 is connected to ground. The wafer 40 is held on the chuck 14 by applying a D.C. voltage from the chucking voltage source 48 to the electrode 62. The application of voltage across the insulator layer 60 polarizes the insulator 60 and induces an opposite (attractive) image charge in the bottom surface of the wafer 40. In the case of a semi-insulator layer 60, in addition to inducing image charge in the bottom surface of the wafer, charge from the electrode 62 migrates through the semi-insulator layer 60 to accumulate very close to the top surface of the semi-insulator layer 60, for a minimum gap between the charge and the overlying wafer 40. (The term "semi-insulator" is discussed below.) This induces an opposite (attractive) image charge in the bottom surface of the wafer 40. The effective gap between the two opposing charge layers is so minimal as a result of the upward charge migration in the insulator layer 60 that the attractive force between the chuck and the wafer 40 is very large for a relatively small applied chucking voltage. For example, a chucking voltage of only 300 volts D.C. on the electrode 62 produces a chucking force across the wafer 40 equivalent to a pressure of about 100 Torr. The puck semi-insulator layer 60 therefore is formed of a material having a desired charge mobility, so that the material is not a perfect insulator (hence, the term "semi-insulator"). This semi-insulator material, although not a perfect insulator, may also not be a typical semiconductor, in some cases. In any case, the charge induced by the chucking voltage on the electrode 62 is mobile in the semi-insulator material of the puck layer 60, and therefore it may be said that the puck semi-insulator layer 60 is formed of a "charge mobile" material. One example of a material suitable for the puck semi-insulator or charge mobile layer 60 is aluminum nitride. Another example is aluminum oxide, which may optionally be doped to increase charge mobility. For example, the dopant material may be titanium dioxide.

RF bias power from the RF bias power generators 125, 125' may be applied through the impedance match circuit 130 to the electrode 62 or, alternatively, to the metal layer 64 for RF coupling through the semi-insulative puck layer 60.

A very high heat transfer coefficient between the wafer 40 and the puck 60 is realized by maintaining a very high chucking force. A suitable range for this force depends upon the anticipated heat loading of the wafer, and will be discussed later in this specification. The heat transfer coefficient (having units of Watts/m$^{2\circ}$ K or heat flux density for a given temperature difference) of the wafer-to-puck contacting surfaces is adequate to remove heat at the rate heat is deposited on the wafer. Specifically, the heat transfer coefficient is adequate because during plasma processing it either limits the wafer temperature below a specified maximum temperature or limits the time rate of rise of the wafer temperature below a maximum rate of rise. The maximum wafer temperature may be selected to be anywhere in a practical range from on the order to 100 degrees C. or higher, depending upon the heat load. The maximum rate of heat rise during processing may be anywhere in a range from 3 to 20 degrees per second. Specific examples may be 20 degrees per second, or 10 degrees per second or 3 degrees per second. By comparison, if the wafer is un-cooled, the rate of heat rise may be 86.7 degrees per second in the case of a typical 300 mm silicon wafer with a heat load of 7500 Watts, 80% of which is absorbed by the wafer. Thus, the rate of temperature rise is reduced to one-fourth of the un-cooled rate of heat rise in one embodiment of the invention.

Such performance is accomplished, first, by maintaining the puck at a sufficiently low temperature (for example, about 80° C. below the target wafer temperature), and second, by providing the top surface of the puck 60 with a sufficiently smooth finish (e.g., on the order of ten's of micro-inches RMS deviation, or preferably on the order of micro-inches RMS deviation). For this purpose, the top surface 60a of the puck 60 can be highly polished to a finish on the order of about 2 micro-inches RMS deviation, for example. Furthermore, heat is removed from the puck 60 by cooling the metal layer 64. For this reason, internal coolant passages 70 are provided within the metal layer 64 coupled to a coolant pump 72 and heat sink or cooling source 74. In an alternative embodiment, the internal cooling passages 70 may extend into the puck 60 or adjacent its back surface in addition or instead of extending through the metal layer 64. In any case, the coolant passages 70 are thermally coupled to the puck 60, either directly or through the metal layer 64, and are for cooling the puck 60. The coolant liquid circulating through the internal passages 70 can be water, ethylene glycol or a mixture, for example. Alternatively, the coolant may be a perfluorinated heat transfer liquid such as "fluorinert" (made by 3M company). Unlike the internal gas coolant passages of conventional chucks, this feature presents little or no risk of arcing in the presence of high RF bias power applied to the chuck 14 by the RF bias power generator 125.

One advantage of such contact-cooling of the wafer over the conventional method employing a coolant gas is that the thermal transfer efficiency between the coolant gas and each of the two surfaces (i.e., the puck surface and the wafer bottom surface) is very limited, in accordance with the thermal accommodation coefficient of the gas with the materials of the two surfaces. The heat transfer rate is attenuated by the product of the gas-to-wafer thermal accommodation coefficient and the gas-to-puck thermal accommodation coefficient. If both coefficients are about 0.5 (as a high rough estimate), then the wafer-gas-puck thermal conductance is attenuated by a factor of about 0.25. In contrast, the contact-cooling thermal conductance in the present invention has virtually no such attenuation, the thermal accommodation coefficient being in effect unity for the chuck 14 of FIGS. 1A-4. Therefore, the contact cooling electrostatic chuck 14 can outperform conventional electrostatic chucks (i.e., electrostatic chucks that that employ gas cooling) by a factor of about four (or more) with sufficiently high attractive electrostatic force between wafer and puck. We have observed in preliminary tests an improvement of about a factor of three.

The heat transfer coefficient between the wafer 40 and the puck 60 in the wafer contact-cooling electrostatic chuck 14 is affected by the puck top surface finish and the chucking force. These parameters can be adjusted to achieve the requisite heat transfer coefficient for a particular environment. An important environmental factor determining the required heat transfer coefficient is the applied RF bias power level. It is believed that at least 80% of the RF bias power from the bias generator 125 is dissipated as heat in the wafer 40. Therefore, for example, if the RF bias power level is 7500 Watts and 80% of the RF bias power from the bias generator 125 is dissipated as heat in the wafer 40, if the wafer area is 706 cm$^2$ (300 mm diameter wafer) and if a 80 degrees C. temperature difference is allowed between the wafer 40 and the puck 60, then the required heat transfer coefficient is h=7500×80% Watts/(706 cm$^2$×80 degrees K), which is 1071 Watts/m$^{2\circ}$ K. For greater RF bias power levels, the heat transfer coefficient can be increased by augmenting any one or both of the foregoing factors, namely the temperature drop across the puck, the chucking force or the smoothness of the puck surface. Such a high heat transfer coefficient, rarely attained in conventional electrostatic chucks, is readily attained in the electrostatic chuck 14 of FIG. 2 by applying a sufficiently high chucking voltage, on the order of 1 kV, for example.

In addition, the heat transfer is improved by providing more puck surface area available for direct contact with the wafer backside. In a conventional chuck, the puck surface available for wafer contact is greatly reduced by the presence of open coolant gas channels machined, ground or otherwise formed in the puck surface. These channels occupy a large percentage of the puck surface.

Dual Bias Power Frequencies for Enhanced Etch Performance:

The reactor of FIG. 1A employs two different bias power frequencies, namely f1 and f2, in order to optimize etch performance. The first bias frequency f1 is a low frequency (LF) RF signal, such as 2 MHz, and is sufficiently low for ions at the plasma sheath to follow the oscillations of its electric field. Since some of the ions that are in phase with the LF electric field will be accelerated across the sheath while other ions that are out of phase with the LF electric field will be decelerated across the plasma sheath, the LF bias source provides a relatively wide spectrum of ion energy. For example, for a nominal RF bias level of 1000 volts at 2 MHz, the ion energy will range from about 300 eV to 1800 eV. The second bias frequency f2 is a high frequency (HF) RF signal that is too high to be followed by ions at the plasma sheath, so that the ion energy distribution produced by the HF bias source is relatively narrow and is centered at an average value corresponding to half the peak-to-peak voltage. The combination of the narrow ion energy distribution of the HF bias source (of frequency f2) and the broad ion energy distribution of the LF bias source (of frequency f1) produces an ion energy distribution extending from the average ion energy level generated by the HF bias source to the higher ion energy levels generated by the LF bias source. It is believed that such higher ion energy levels enhance etch performance. The problem is that intermodulation products between the two bias frequencies, f1 and f2, make it seemingly impossible to accurately measure the net wafer voltage.

Wafer Contact Force Feedback Control:

Conventional sensing circuits 132 within the impedance match circuit 130 have output terminals 133 providing signals indicating, respectively, the low frequency voltage V(f1), current I(f1) and (optionally) power $P_{bias}$(f1), and the high frequency voltage V(f2), current I(f2) and (optionally) power $P_{bias}$(f2) furnished at the output of the impedance match circuit 130 to the wafer support pedestal 14. A measurement instrument 140 uses the signals from the output terminals 133 to measure the voltage on the wafer 40. The measurement instrument 140 employs processes based upon an electrical model of the reactor 100 discussed below. A processor 80 periodically computes the D.C. voltage of the wafer 40. A subtractor 82 computes the net chucking voltage as the difference between the D.C. wafer voltage and the D.C. voltage applied to the pedestal 14 by the chucking voltage source 48. A feedback controller 84 compares the net chucking voltage provided by the subtractor 82 with a desired net chucking voltage to determine an error, and applies a corrective signal to change the D.C. output of the D.C. voltage supply 48 so as to reduce this error. The desired net chucking voltage may be furnished by a wafer temperature control processor that translates a user-commanded wafer temperature to a desired net chucking voltage.

Figure 1B:
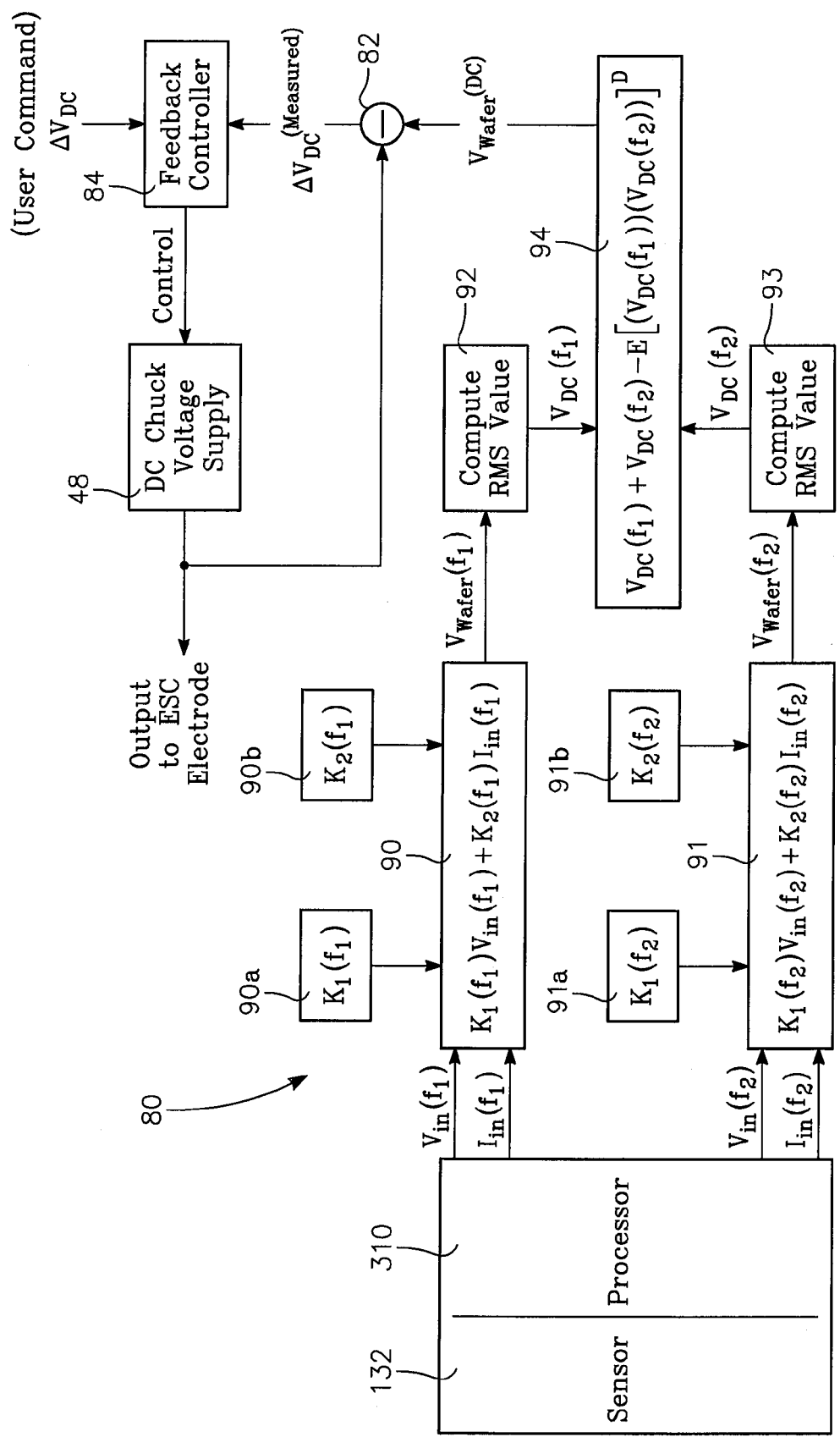
FIG. 1B is a block diagram of apparatus within the measurement instrument for determining wafer voltage based upon the HF and LF components of the bias supply voltage and current for the feedback control loop.

Measurement of the Wafer Voltage With a Correction for Intermodulation Products of f1 and f2:

Referring to FIG. 1B, a processor 90 determines the voltage $V_{junction}$ at the electrode or grid 62 by multiplying the voltage $V_{in}$ and current $I_{in}$ measured at the input to the cable 210 by respective constants and summing the two products. As disclosed in co-pending U.S. application Ser. No. 10/440,364 filed May 16, 2003 by Daniel Hoffman and assigned to the present assignee, this multiplication and summing takes the following form:

$$V_{in}\{\cos h\,[(V_{ch})(-\text{length})]\}+I_{in}\{Z_{ch}\sin h[(V_{ch})(-\text{length})]\}$$

so that one constant is $\cos h\,[(V_{ch})(-\text{length})]$ and the other constant is $Z_{ch}\sin h\,[(V_{ch})(-\text{length})]$. These two constants are referred to herein as K1 and K2, respectively. $Z_{ch}$ is the characteristic impedance of the coaxial cable 210, $V_{ch}$ is the complex phase velocity of the cable 210 and "length" is the cable length. The voltage $V_{wafer}$ at the wafer 40 is obtained by incorporating into each of the constants the factor $Z_{wafer}/Z_{grid}$, in accordance with the operation of the processor 520 of FIG. 5A and the processor 830 of FIG. 8A of the referenced application. $Z_{wafer}$ is the impedance between the grid 62 and the wafer 120 while $Z_{grid}$ is the impedance between the grid 62 and ground. With this correction factor incorporated into the constants, they become as follows:

$$K1=(Z_{wafer}/Z_{grid})\cos h\,[(V_{ch})(-\text{length})]$$

$$K2=(Z_{wafer}/Z_{grid})Z_{ch}\sin h\,[(V_{ch})(-\text{length})].$$

The foregoing is valid for a single bias frequency, in accordance with the referenced application. Each of the parameters $Z_{wafer}$, $Z_{grid}$ and $V_{ch}$ is evaluated at the particular bias frequency, so that K1 and K2 depend upon frequency.

In the reactor of FIG. 1A, there are two bias sources 125, 125' providing bias power at the LF frequency f1 and at the HF frequency f2, respectively. Therefore two processors 90 and 91 of FIG. 1B separately compute the wafer voltages at the respective bias frequencies f1, f2, employing the constants K1, K2 evaluated at the different bias frequencies, as follows: K1(f1), K2(f1), K1(f2), K2(f2). The measurement instrument 132 provides the LF input voltage $V_{in}$(f1) and input current $I_{in}$(f1) to the processor 90 and the HF input voltage $V_{in}$(f2) and input current $I_{in}$(f2) to the processor 92. The LF processor 90 employs the LF constants K1(f1), K2(f1) while the HF processor 91 employs the HF constants K1(f2), K2(f2), to produce the LF wafer voltage $V_{wafer}$(f1) and the HF wafer voltage $V_{wafer}$(f2), respectively. The two RF wafer voltages, $V_{wafer}$(f1) and $V_{wafer}$(f2), are then used to determine the measured D.C. wafer voltage as follows. First, wafer D.C. voltages at the two frequencies, $V_{DC}$(f1), $V_{DC}$(f2) are determined as the RMS values of the LF and HF wafer voltages, $V_{wafer}$(f1), $V_{wafer}$(f2), by processors 92, 93, respectively.

In order to determine the total D.C. voltage on the wafer attributable to both frequency components, we have found significant errors occur when a simple addition of the two frequency components, $V_{DC}$(f1)+$V_{DC}$(f2), is employed. This is because such a simple addition does not take into account the effects of intermodulation between the two bias frequencies. As discussed earlier in this specification, the error can exceed the capacity of the chucking D.C. voltage supply 48. Therefore, a correction factor is subtracted from the result, the correction factor containing the product of the two D.C. voltage components $V_{DC}$(f1), $V_{DC}$(f2). The combination of the simple sum and the correction factor is carried out by a processor 94 to determine total D.C. voltage on the wafer:

$$V_{DC}(\text{total})=V_{DC}(f1)+V_{DC}(f2)+E\{[V_{DC}(f1)][V_{DC}(f2)]\}^F$$

Where E and F are constants. Theoretically, F=½ and E=1, but in practical application we have found superior results are obtained with F=0.43 and E=1. This provides a highly accurate measurement of the D.C. voltage on the wafer, $V_{DC}$(wafer), which is the input to the feedback control loop 82, 84, 48 governing the ESC clamping force applied to the wafer. The subtractor 82 determines the net wafer clamping voltage, $\Delta V_{DC}$, as the difference between the measured D.C. wafer voltage from the processor 80, $V_{DC}$(total), and the D.C. voltage output by the D.C. chuck voltage supply 48. The feedback controller 84 compares this value with a desired clamping voltage to determine an error, and changes the output of the ESC D.C. voltage supply 48 so as to reduce this error.

Measurement of the Wafer Voltage Based Upon the Electrical Characteristics of the Chamber:

FIG. 2 depicts an electrical model of the plasma reactor of FIG. 1A that defines electrical parameters of the certain reactor components used in the measurement instrument 140 to determine voltage on the wafer 40 from RF voltage and current at the output of the impedance match 130. In the model of FIG. 2, the electrostatic chuck (ESC) 14 includes the dielectric puck 60 containing the electrode or conductive grid 62, the puck 60 being divided by the electrode 62 into a thin overlying dielectric layer 115-2 and an underlying dielectric layer 115-3. The layer 115-3 can model the combination of the layers 60 (lower portion), 64 and 66 that separate the electrode 62 from the grounded metal base 68. FIG. 2 also shows the coaxial cable 210 connecting the output of the impedance match circuit 130 to the grid 62. The coaxial cable 210 has an inner conductor 212 and an outer conductor 214.

The electrical model depicted in FIG. 2 characterizes the electrical properties of the plasma reactor, which are readily determined using conventional techniques. Specifically, the coaxial transmission line or cable 210 is characterized by three quantities: (1) its length, (2) $Z_{ch}$, its characteristic impedance, and (3) $V_{ch}$, its complex phase velocity in the transmission line equation. Since the complex phase velocity $V_{ch}$ depends upon the frequency of the signal propagating through the coaxial cable, it will be referred to herein as $V_{ch}(f)$ in order to indicate its dependency upon frequency. The ESC 14 is characterized by electrical properties of the overlying and underlying dielectric layers 115-2 and 115-3. Specifically, the underlying dielectric layer 115-3 has a capacitance $C_D$, which is a function of (1) the dielectric constant, $\in_D$, of the dielectric layer 115-3, and (2) the conductive loss component of the dielectric layer 115-3, $\tan_D$, (3) the thickness, gap, of the dielectric layer 115-3 and (4) the radius of the wafer 40. The conductive loss component $\tan_D$ depends upon the frequency of the signal being coupled through the dielectric layer, and therefore it will be referred to herein as $\tan_D(f)$ in order to indicate its dependency upon frequency. The overlying dielectric layer 115-2 has a capacitance $C_P$ which is a function of (1) the thickness, $gap_P$, of the dielectric layer 115-2, (2) the dielectric constant, $\in_P$, of the dielectric layer 115-2 and (3) the conductive loss component of the dielectric layer 115-2, $\tan_P$. The conductive loss component $\tan_P$ depends upon the frequency of the signal being coupled through the dielectric layer, and therefore it will be referred to herein as $\tan_P(f)$ in order to indicate its dependency upon frequency.

Figure 3A:
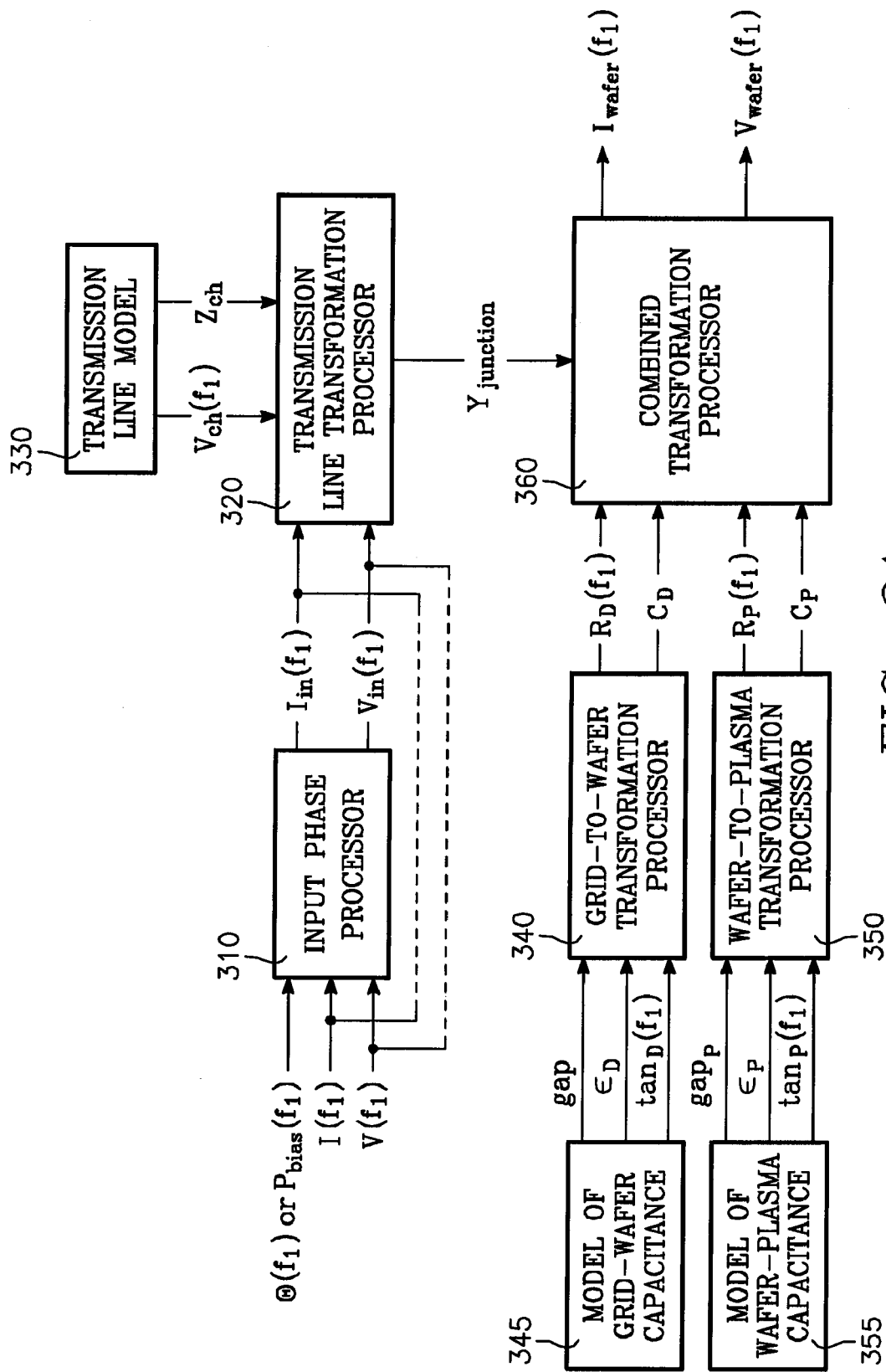
FIG. 3A illustrates the structure of the LF section of the measurement instrument of FIG. 1.
Figure 3B:
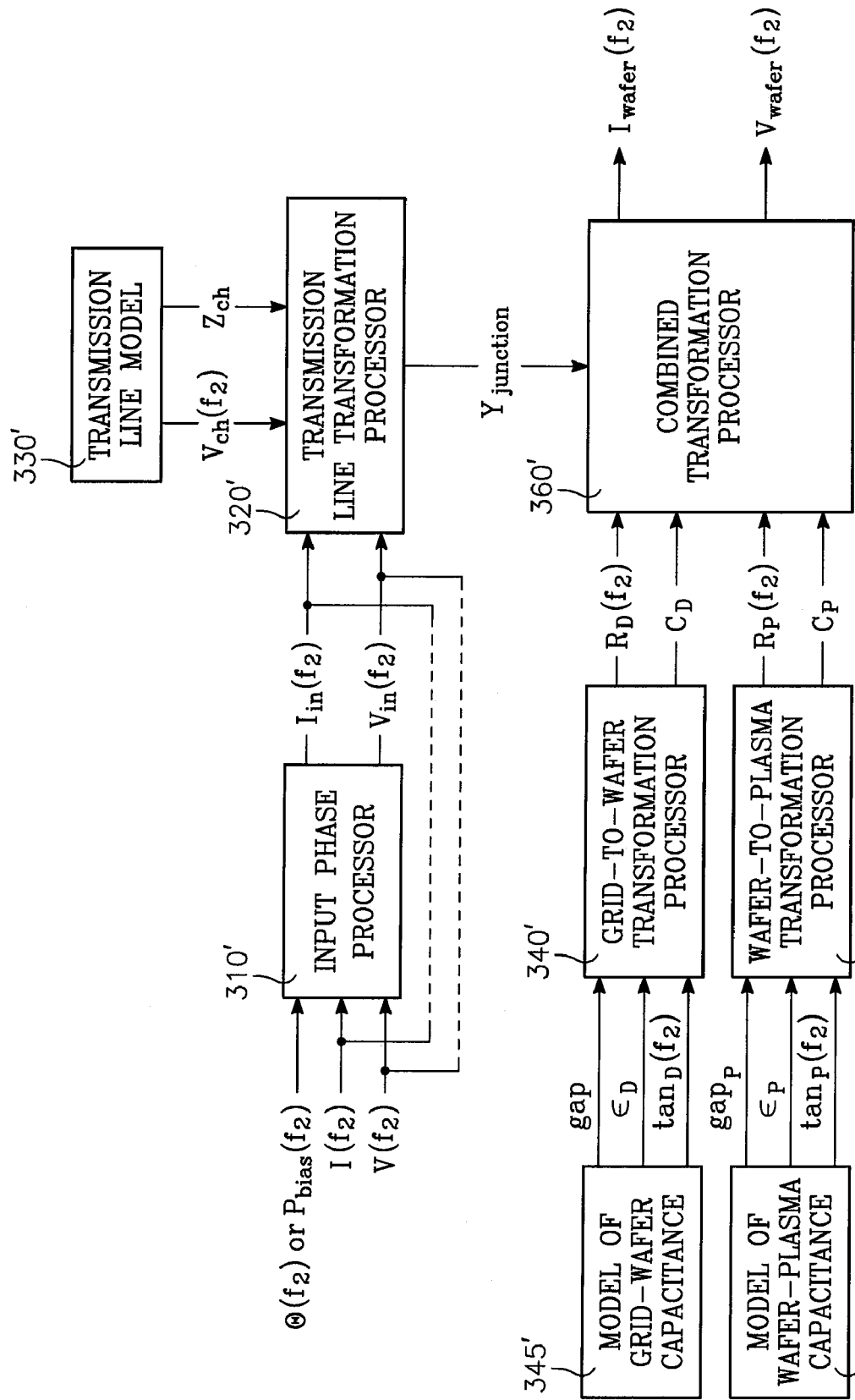
FIG. 3B illustrates the structure of the HF section of the measurement instrument of FIG. 1.

In one implementation, the measurement instrument 140 of FIG. 1A can be divided into two sections 140a, 140b, dedicated to the measurement of the respective components of the wafer voltage at the frequencies f1, f2, respectively. For this purpose, the output signals from the sensor 132 pertaining to the LF components (i.e., V(f1), I(f1), P(f1)) are provided to the measurement instrument section 140a, while the output signals from the sensor 132 pertaining to the HF components (i.e., V(f1), I(f1), P(f1)) are provided to the measurement instrument section 140b. The two sections 140a, 140b will therefore employ different values of the frequency-dependent model parameters referred to above. Thus, the measurement instrument section 140a uses $V_{ch}$(f1), $\tan_D$(f1), $\tan_P$(f1), which are the values of these frequency-dependent parameters evaluated at the LF frequency f1. Likewise, the measurement instrument section 140b uses $V_{ch}$(f2), $\tan_D$(f2), $\tan_P$(f2), which are the values of these frequency-dependent parameters evaluated at the HF frequency f2. FIGS. 3A and 3B illustrates the structure of the respective measurement instrument sections 140a, 140b of FIG. 1A.

The LF Measurement Instrument Section 140a:

Referring to FIG. 3A, in the measurement instrument section 140a, an input phase processor 310 receives the low frequency (LF) $P_{bias}$(f1), V(f1) and I(f1) signals from the impedance match sensing circuit 132 of FIG. 1A and produces respective signals indicating an LF input current $I_{in}$(f1) and an LF input voltage $V_{in}$(f1) at the near end of the coaxial cable 210 (i.e., the end nearest the impedance match circuit 130). [In one embodiment, the input phase processor 310 is not employed, so that the LF input current and voltage, $I_{in}$(f1), $V_{in}$(f1), are the same as the LF voltage and current, V(f1), I(f1), from the sensor 132. This simplification avoids the complications of computing phase as is done in the processor 310.] A transmission line transformation processor 320 uses the characteristic impedance $Z_{ch}$ and the complex phase velocity or loss coefficient $V_{ch}$(f1) from an electrical model 330 of the coaxial cable 210 to transform from $I_{in}$ and $V_{in}$ at the near cable end to a voltage $V_{junction}$ at the far cable end, i.e., at the junction between the coaxial cable 210 and the grid 62. A grid-to-ground transformation processor 340 takes radius, gap, $\in_D$ and $\tan_D$(f1) from a model 345 of the grid-to-ground capacitance and produces a dielectric resistance $R_D$(f1) and dielectric capacitance $C_D$. A grid-to-wafer transformation processor 350 takes radius, $gap_P$, $\in_P$ and $\tan_P$(f1) from a model 355 of the grid-to-wafer capacitance and produces a plasma resistance $R_P$(f1) and a plasma capacitance $C_P$. A combined transformation processor 360 accepts the outputs of all the other processors 320, 340, 350 and computes the wafer voltage $V_{wafer}$(f1).

In summary, electrical measurements are made at the output of the impedance match circuit 130. The transmission line transformation processor 320 transforms these measurements at the near end of the cable 210 to a voltage at the far end. The grid to ground transformation processor 340 provides the transformation from the ground plane 64 near the far end of the cable to the conductive grid 62. The grid-to-wafer transformation processor 350 provides the transformation from the conductive grid 62 to the wafer 40.

The transmission line model 330, the model of the grid-to-ground capacitance 345 and the model 355 of the grid-to-wafer capacitance are not necessarily a part of the measurement instrument 140. Or, they may be memories within the measurement instrument 140 that store, respectively, the coaxial cable parameters ($V_{ch}$(f1) and $Z_{ch}$), the grid-to-ground capacitance parameters (gap, $\in_D$, $\tan_D$(f1) and radius) and the grid-to-wafer capacitance parameters ($gap_P$, $\in_P$, $\tan_P$(f1) and radius).

Figure 4A:
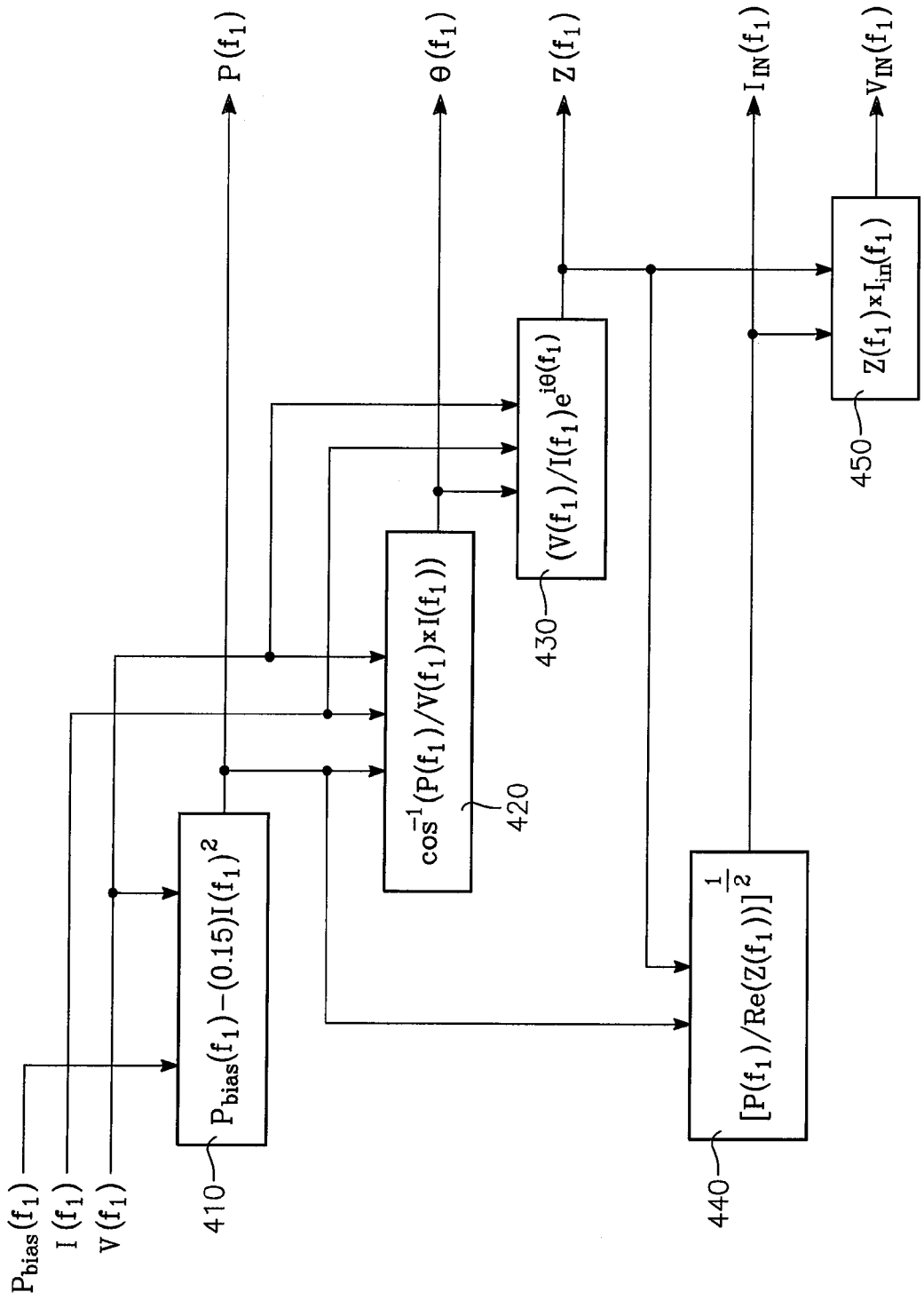
FIG. 4A illustrates an input phase processor of the LF measurement instrument section of FIG. 3A.

FIG. 4A illustrates the structure of the input phase processor 310 of FIG. 3A. A delivered power arithmetic logic unit (ALU) 410 computes delivered power P(f1) from the outputs I(f1) and $P_{bias}$(f1) of the impedance match sensing circuit 132 as $P_{bias}$(f1)−(0.15)I(f1)$^2$. A phase angle ALU 420 computes phase angle θ(f1) from the delivered power P(f1) and from V(f1) and I(f1) as $\cos^{-1}$[P(f1)/V(f1)I(f1)]. An impedance ALU 430 computes the complex impedance Z(f1) as (V(f1)/I(f1))$e^{i\theta}$, where i=$(-1)^{1/2}$. An input current ALU 440 computes the input current $I_{in}$(f1) to the coaxial cable 210 as [P(f1)/Re(Z(f1))]$^{1/2}$. An input voltage ALU 450 computes the input voltage $V_{in}$(f1) to the coaxial cable 210 as Z(f1)$I_{in}$(f1).

Figure 5A:
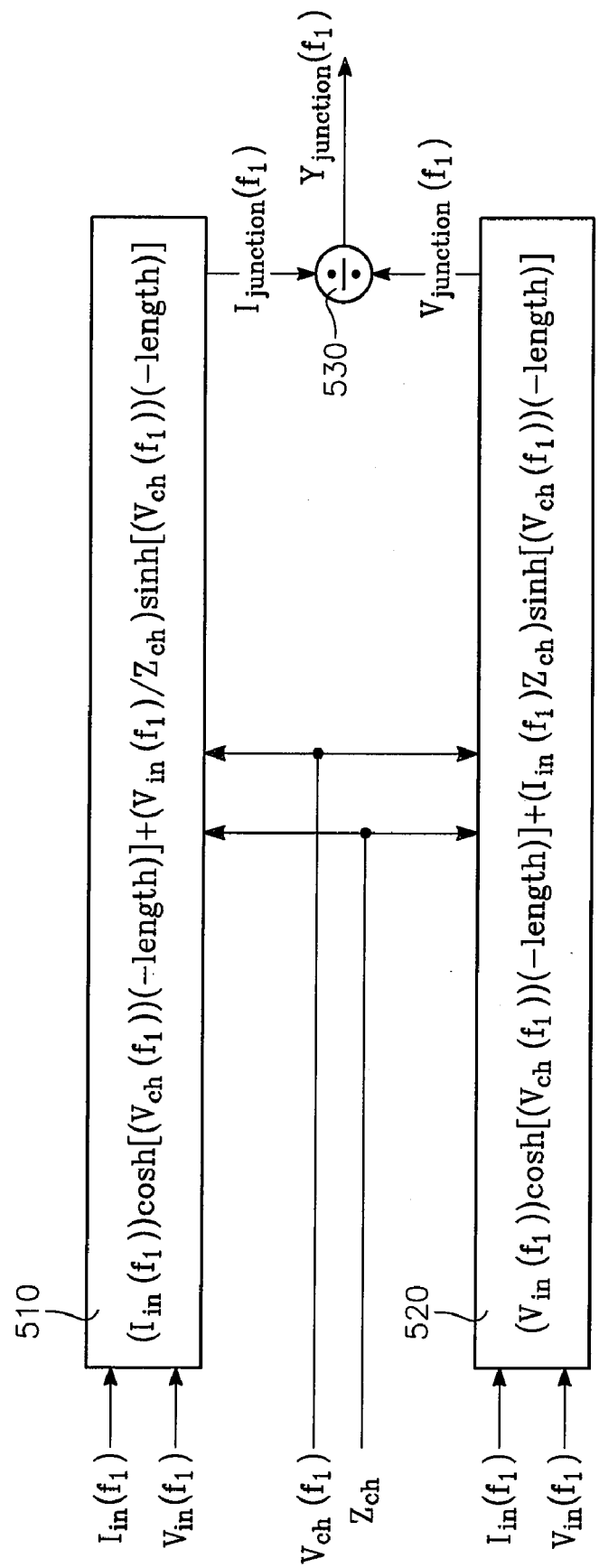
FIG. 5A illustrates a transmission line transformation processor in the measurement instrument LF section of FIG. 3A.

FIG. 5A illustrates the structure of the transmission line transformation processor 320 of FIG. 3A. The transmission line processor receives $I_{in}$(f1) and $V_{in}$(f1) as inputs from the input phase processor 310 of FIG. 4A and uses the transmission line model parameters $V_{ch}$(f1) and $Z_{ch}$ (from the transmission line model or memory 330 of FIG. 3A) to compute the junction voltage at the cable out end, $V_{junction}$ (f1) and admittance $Y_{junction}(f1)$ as follows: A junction current ALU 510 computes the current $I_{junction}(f1)$ at the junction of the coaxial cable 210 and the grid 62 (FIG. 1A) as:

$$I_{in}(f1)\{\cos h\,[V_{ch}(f1)(-length)]\}+V_{in}(f1)\{(1/Z_{ch})\sin h\,[V_{ch}(f1)(-length)]\}$$

A junction voltage ALU 520 computes the voltage $V_{junction}(f1)$ at the junction between the coaxial cable 210 and the grid 62 as:

$$V_{in}(f1)\{\cos h\,[(V_{ch}(f1)(-length)]+I_{in}(f1)\{Z_{ch}\sin h\,[V_{ch}(f1)(-length)]\}$$

A divider 530 receives $I_{junction}$ and $V_{junction}$ computes $Y_{junction}$ as $I_{junction}/V_{junction}$. Each of the electrical quantities in the foregoing computations (current, voltage, impedance, admittance, etc.) may be a complex number having both a real part and an imaginary part.

Figure 6A:
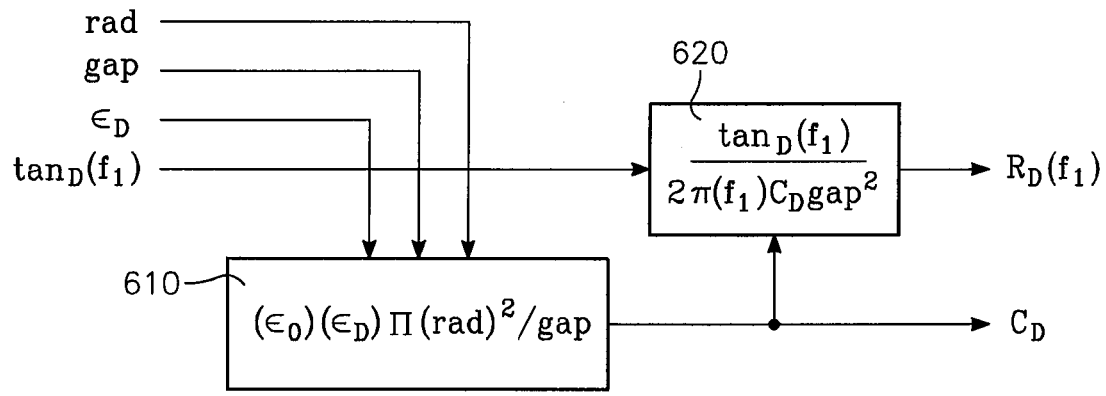
FIG. 6A illustrates a grid-to-ground transformation processor in the measurement instrument LF section of FIG. 3A.

FIG. 6A illustrates the structure of the grid-to-ground transformation processor 340 of FIG. 3A. The grid-to-ground transformation processor 340 receives the parameters gap, $\in_D$, $\tan_D(f1)$ and rad (the wafer radius) from the grid-to-ground model or memory 345 of FIG. 3A computes the dielectric resistance $R_D(f1)$ and the dielectric capacitance $C_D$. The dielectric capacitance $C_D$ is computed by a CD ALU 610 as follows:

$$(\in_0)(\in_D)\pi(rad)^2/gap$$

where $\in_0$ is the electrical permittivity of free space. An RD ALU 620 uses the value of $C_D$ from the CD ALU 610 and computes the dielectric resistance $R_D(f1)$ as follows:

$$(\tan_D(f1))/(2\pi)(f1)C_D\,gap^2)$$

Figure 7A:
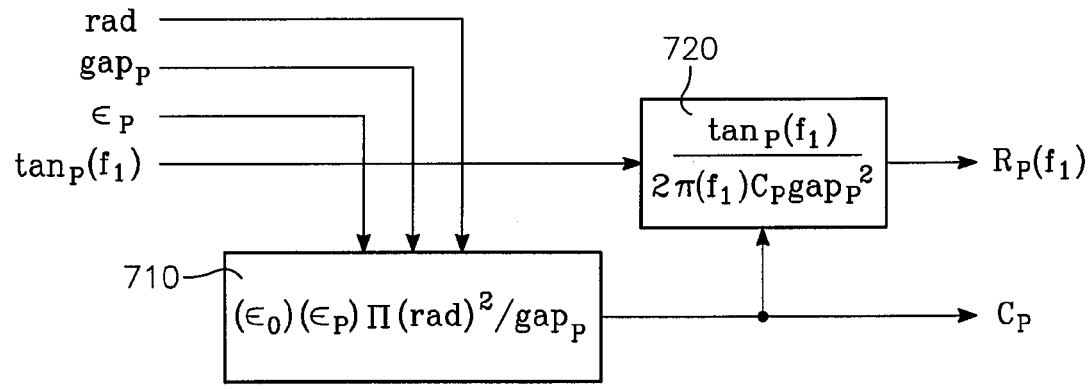
FIG. 7A illustrates a grid-to-wafer transformation processor in the measurement instrument LF section of FIG. 3A.

FIG. 7A illustrates the structure of the grid-to-wafer transformation processor 350 of FIG. 3A. The grid-to-wafer transformation processor 350 receives the parameters $gap_P$, $\in_P$, $\tan_P(f1)$ and rad from the grid-to-wafer model or memory 355 of FIG. 3A and computes the plasma resistance $R_P(f1)$ and the plasma capacitance $C_P$. The plasma capacitance $C_P$ is computed by a CP ALU 710 as follows:

$$(\in_0)(\in_P)\pi(rad)^2/gap_P$$

where $\in_0$ is the electrical permittivity of free space. An RP ALU 720 uses the value of $C_P$ from the CP ALU 710 and computes the plasma resistance $R_P(f1)$ as follows:

$$(\tan_P(f1))/((2\pi)(f1)C_P\,gap_P^2)$$

Figure 8A:
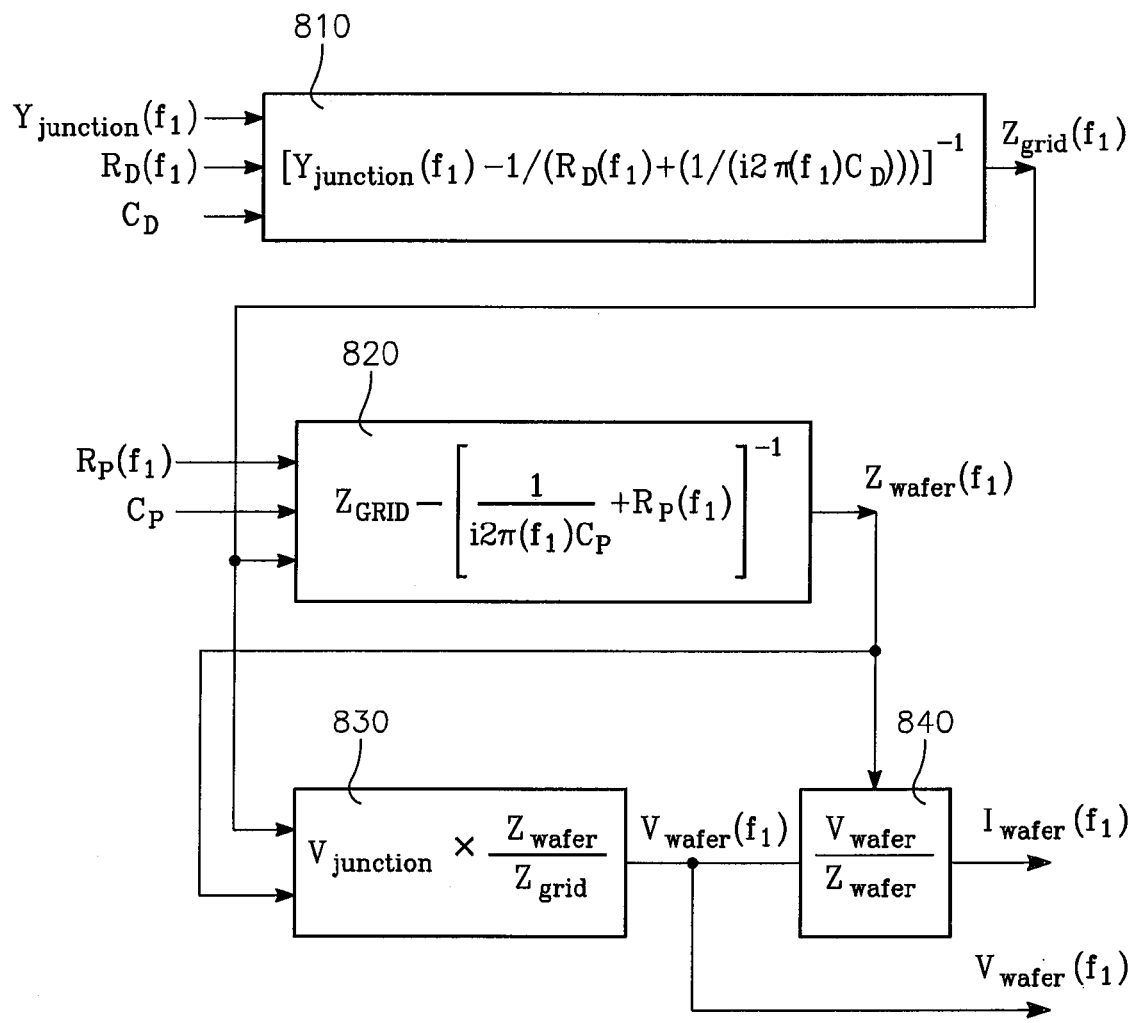
FIG. 8A illustrates a combined transformation processor in the measurement instrument LF section of FIG. 3A.

FIG. 8A illustrates the structure of the combined transformation processor 360 of FIG. 3A. The combined transformation processor 360 receives the parameters $R_D(f1)$, $C_D$ from the processor 340 of FIG. 3A, receives the parameters $R_P(f1)$, $C_P$ from the processor 350 of FIG. 3A and receives the parameter $Y_{junction}$ from the processor 320 of FIG. 3A. A grid impedance ALU 810 computes $Z_{grid}$ (the impedance at the grid 62) as follows:

$$[Y_{junction}(f1)-1/(R_D(f1)+(1/(i2\pi(f1)C_D)))]^{-1}$$

A wafer impedance ALU 820 uses the output of the grid impedance ALU 810 to compute $Z_{wafer}$ (the impedance at the wafer 40 of FIG. 2) as follows:

$$Z_{grid}(f1)-1/(R_P(f1)+(1/(i2\pi(f1)C_P)))$$

A wafer voltage ALU 830 uses the outputs of both ALUs 810 and 820 and $V_{junction}(f1)$ from the divider 530 of FIG. 5A to compute the voltage on the wafer 120 of FIG. 2, $V_{wafer}(f1)$, as $V_{junction}(f1)Z_{wafer}(f1)/Z_{grid}(f1)$.

It should be noted that the exact computation of $Z_{grid}(f1)$ depends upon both $V_{in}(f1)$ and $I_{in}(f1)$ in respective transmission line equations for the voltage and current $V_{junction}(f1)$, $I_{junction}(f1)$ as described above, so that $Z_{grid}(f1)$ is not necessarily a constant. In order to simplify the computation of the wafer voltage $V_{wafer}(f1)$, the factor $Z_{wafer}(f1)/Z_{grid}(f1)$ is ignored (assigned a value of unity) Alternatively, the computation may be simplified by choosing an average value of $Z_{grid}(f1)$ within an applicable operating process window as a constant to replace the exact computation of $Z_{grid}(f1)$ in the determination of $V_{wafer}(f1)$. With this simplification, the factor $Z_{wafer}(f1)/Z_{grid}(f1)$ becomes a constant, so that the determination of the wafer voltage $V_{wafer}(f1)$ by ALU 380 becomes multiplication of the cable/electrode junction voltage $V_{junction}(f1)$ by a constant (i.e., by the factor $Z_{wafer}(f1)/Z_{grid}(f1)$. This may reduce the accuracy slightly but has the advantage of simplifying the computation of $V_{wafer}(f1)$.

If desired, a processor 840 produces a measured wafer current by dividing the wafer voltage $V_{wafer}(f1)$ by the wafer impedance $Z_{wafer}(f1)$.

The HF Measurement Instrument Section 140b:

Referring to FIG. 3B, in the measurement instrument section 140b, an input phase processor 310' receives the high frequency (HF) $P_{bias}(f2)$, $V(f2)$ and $I(f2)$ signals from the impedance match sensing circuit 132 of FIG. 1A and produces respective signals indicating an HF input current $I_{in}(f2)$ and an HF input voltage $V_{in}(f2)$ at the near end of the coaxial cable 210 (i.e., the end nearest the impedance match circuit 130). [In one embodiment, the input phase processor 310' is not employed, so that the HF input current and voltage, $I_{in}(f2)$, $V_{in}(f2)$, are the same as the HF voltage and current, $V(f2)$, $I(f2)$, from the sensor 132.] A transmission line transformation processor 320' uses the characteristic impedance $Z_{ch}$ and the complex phase velocity or loss coefficient $V_{ch}(f2)$ from an electrical model 330 of the coaxial cable 210 to transform from $I_{in}$ and $V_{in}$ at the near cable end to a voltage $V_{junction}$ at the far cable end, i.e., at the junction between the coaxial cable 210 and the grid 62. A grid-to-ground transformation processor 340' takes radius, gap, $\in_D$ and $\tan_D(f2)$ from a model 345 of the grid-to-ground capacitance and produces a dielectric resistance $R_D(f2)$ and dielectric capacitance $C_D$. A grid-to-wafer transformation processor 350' takes radius, $gap_P$, $\in_P$ and $\tan_P(f2)$ from a model 355 of the grid-to-wafer capacitance and produces a plasma resistance $R_P(f2)$ and a plasma capacitance $C_P$. A combined transformation processor 360' accepts the outputs of all the other processors 320', 340', 350' and computes the wafer voltage $V_{wafer}(f2)$.

In summary, electrical measurements are made at the output of the impedance match circuit 130. The transmission line transformation processor 320' transforms these measurements at the near end of the cable 210 to a voltage at the far end. The grid to ground transformation processor 340' provides the transformation from the ground plane 64 near the far end of the cable to the conductive grid 62. The grid-to-wafer transformation processor 350' provides the transformation from the conductive grid 62 to the wafer 40.

The transmission line model 330', the model of the grid-to-ground capacitance 345 and the model 355 of the grid-to-wafer capacitance are not necessarily a part of the measurement instrument 140. Or, they may be memories within the measurement instrument 140 that store, respectively, the coaxial cable parameters ($V_{ch}(f2)$ and $Z_{ch}$), the grid-to-ground capacitance parameters (gap, $\in_D$, $\tan_D(f2)$ and radius) and the grid-to-wafer capacitance parameters ($gap_P$, $\in_P$, $\tan_P(f2)$ and radius).

Figure 4B:
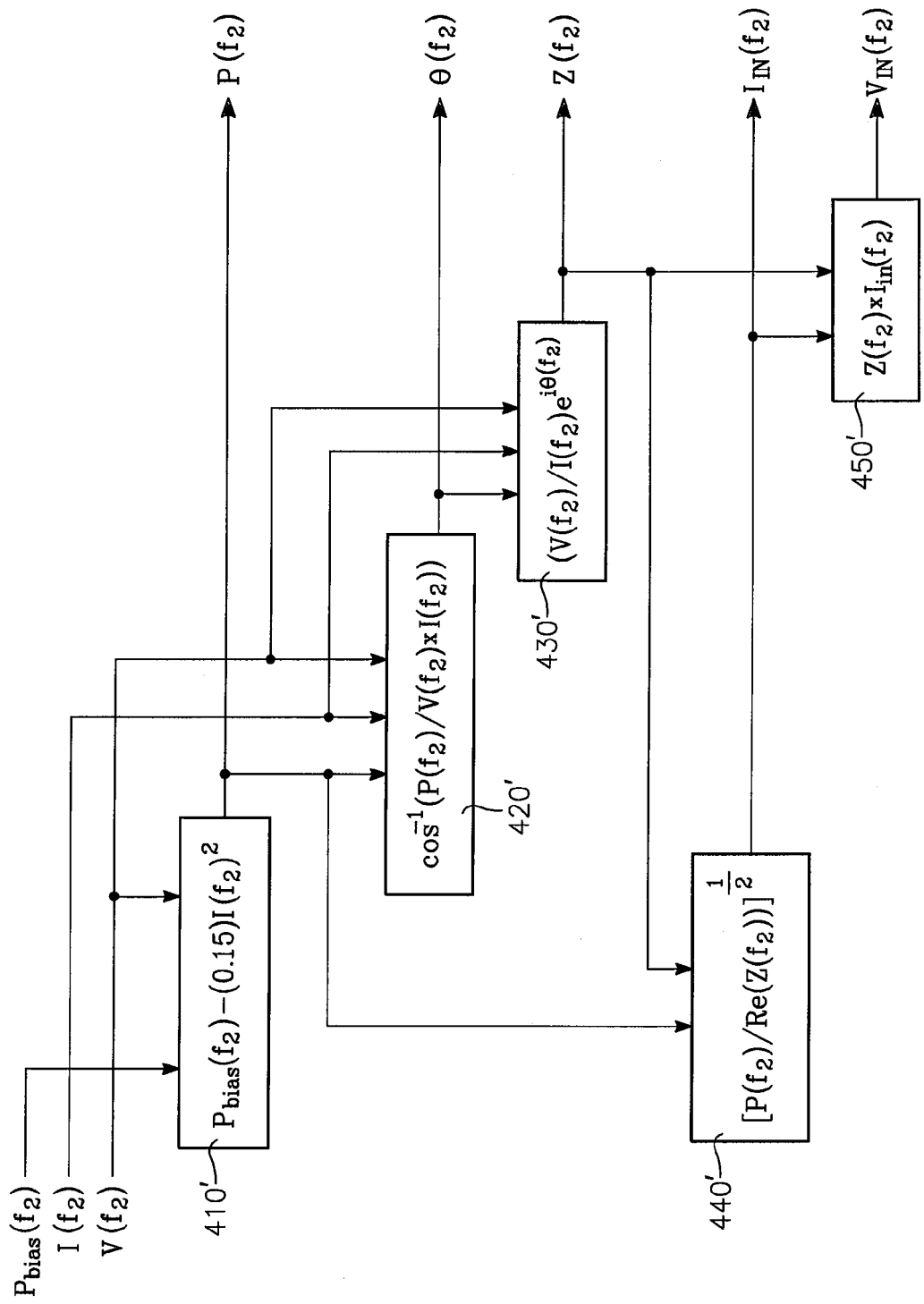
FIG. 4B illustrates an input phase processor of the HF measurement instrument section of FIG. 3B.

FIG. 4B illustrates the structure of the input phase processor 310' of FIG. 3B. A delivered power arithmetic logic unit (ALU) 410' computes delivered power P(f2) from the outputs I(f2) and $P_{bias}$(f2) of the impedance match sensing circuit 132 as $P_{bias}$(f2)−(0.15)I(f2)$^2$. A phase angle ALU 420' computes phase angle θ(f2) from the delivered power P(f2) and from V(f2) and I(f2) as $\cos^{-1}$[P(f2)/V(f2)I(f2)]. An impedance ALU 430' computes the complex impedance Z(f2) as (V(f2)/I(f2))$e^{i\theta}$, where i=$(-1)^{1/2}$. An input current ALU 440' computes the input current $I_{in}$(f2) to the coaxial cable 210 as [P(f2)/Re(Z(f2))]$^{1/2}$. An input voltage ALU 450' computes the input voltage $V_{in}$(f2) to the coaxial cable 210 as Z(f2) $I_{in}$(f2).

Figure 5B:
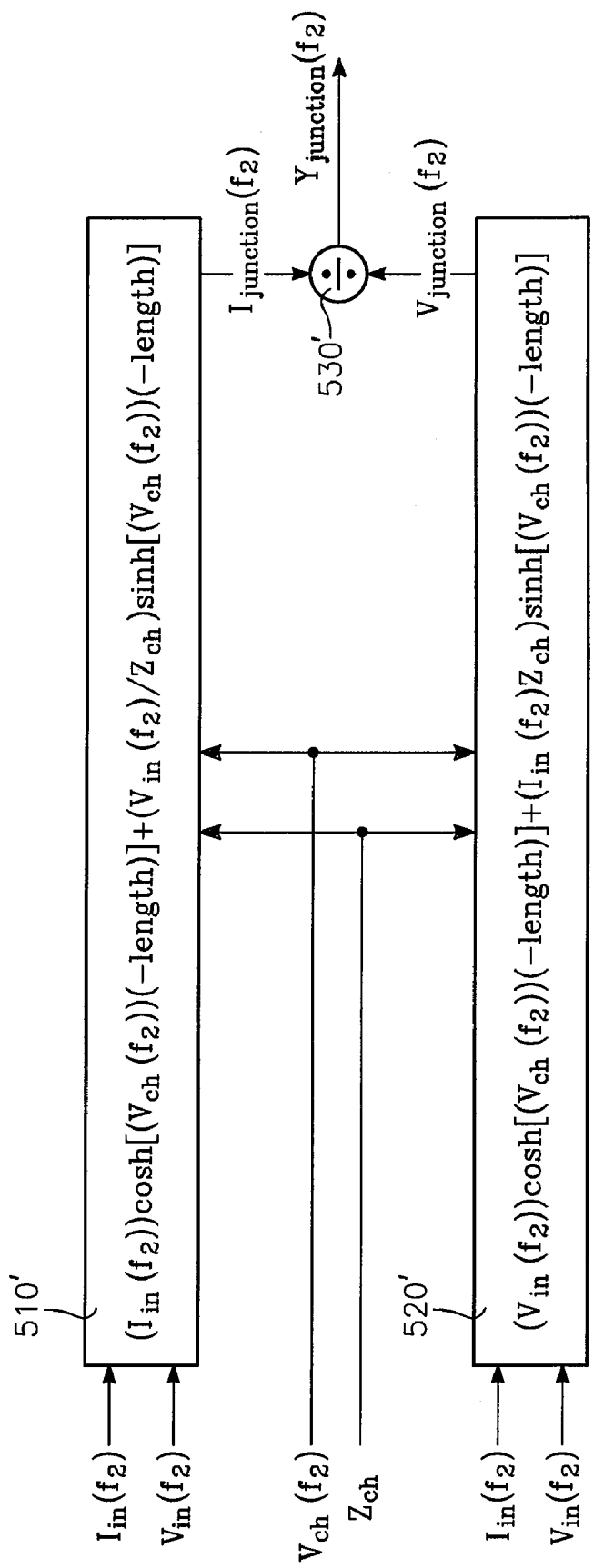
FIG. 5B illustrates a transmission line transformation processor in the measurement instrument HF section of FIG. 3B.

FIG. 5B illustrates the structure of the transmission line transformation processor 320' of FIG. 3B. The transmission line processor receives $I_{in}$(f2) and $V_{in}$(f2) as inputs from the input phase processor 310' of FIG. 4B and uses the transmission line model parameters $V_{ch}$(f2) and $Z_{ch}$ (from the transmission line model or memory 330' of FIG. 3B) to compute the junction voltage at the cable out end, $V_{junction}$(f2) and admittance $Y_{junction}$(f2) as follows: A junction current ALU 510' computes the current $I_{junction}$(f2) at the junction of the coaxial cable 210 and the grid 62 (FIG. 1A) as:

$I_{in}$(f2){ cos h [$V_{ch}$(f2)(−length)]}+$V_{in}$(f2){(1/$Z_{ch}$)sin h [$V_{ch}$(f2)(−length)]}.

A junction voltage ALU 520' computes the voltage $V_{junction}$(f2) at the junction between the coaxial cable 210 and the grid 62 as:

$V_{in}$(f2){ cos h [($V_{ch}$(f2)(−length)]+$I_{in}$(f2){$Z_{ch}$ sin h [$V_{ch}$(f2)(−length)]}.

A divider 530' receives $I_{junction}$ and $V_{junction}$ computes $Y_{junction}$ as $I_{junction}/V_{junction}$. Each of the electrical quantities in the foregoing computations (current, voltage, impedance, admittance, etc.) may be a complex number having both a real part and an imaginary part.

Figure 6B:
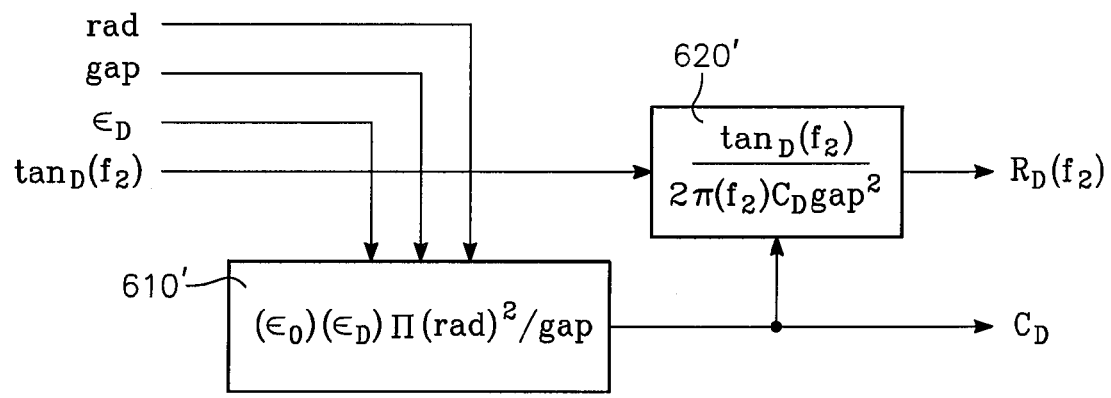
FIG. 6B illustrates a grid-to-ground transformation processor in the measurement instrument HF section of FIG. 3B.

FIG. 6B illustrates the structure of the grid-to-ground transformation processor 340' of FIG. 3B. The grid-to-ground transformation processor 340' receives the parameters gap, $\in_D$, $\tan_D$(f2) and rad (the wafer radius) from the grid-to-ground model or memory 345 of FIG. 3B computes the dielectric resistance $R_D$(f2) and the dielectric capacitance $C_D$. The dielectric capacitance $C_D$ is computed by a CD ALU 610' as follows:

($\in_0$)($\in_D$)π(rad)$^2$/gap where $\in_0$ is the electrical permittivity of free space. An RD ALU 620' uses the value of $C_D$ from the CD ALU 610' and computes the dielectric resistance $R_D$(f2) as follows:

($\tan_D$(f2))(2π)(f1)$C_D$ gap$^2$)

Figure 7B:
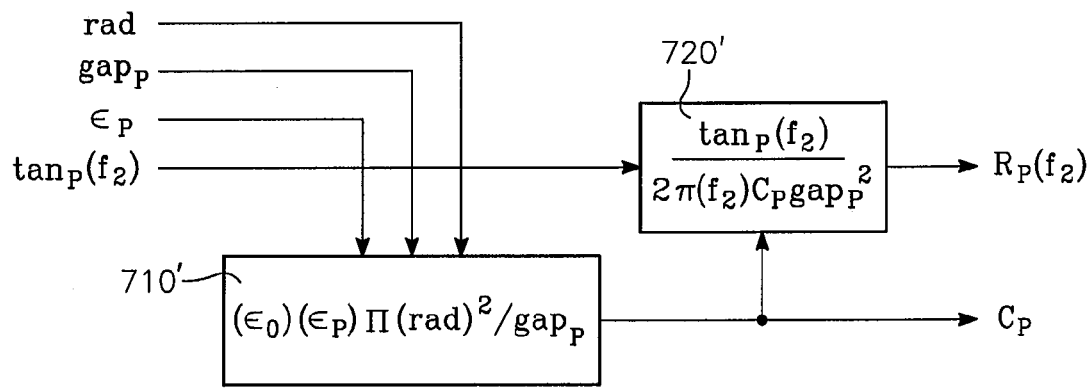
FIG. 7B illustrates a grid-to-wafer transformation processor in the measurement instrument HF section of FIG. 3B.

FIG. 7B illustrates the structure of the grid-to-wafer transformation processor 350' of FIG. 3B. The grid-to-wafer transformation processor 350' receives the parameters $gap_P$, $\in_P$, $\tan_P$(f2) and rad from the grid-to-wafer model or memory 355 of FIG. 3B and computes the plasma resistance $R_P$(f2) and the plasma capacitance $C_P$. The plasma capacitance $C_P$ is computed by a CP ALU 710' as follows:

($\in_0$)($\in_P$)π(rad)$^2$/$gap_P$ where $\in_0$ is the electrical permittivity of free space. An RP ALU 720' uses the value of $C_P$ from the CP ALU 710' and computes the plasma resistance $R_P$(f2) as follows:

($\tan_P$(f2))/((2π)(f1)$C_P$ $gap_D^2$)

Figure 8B:
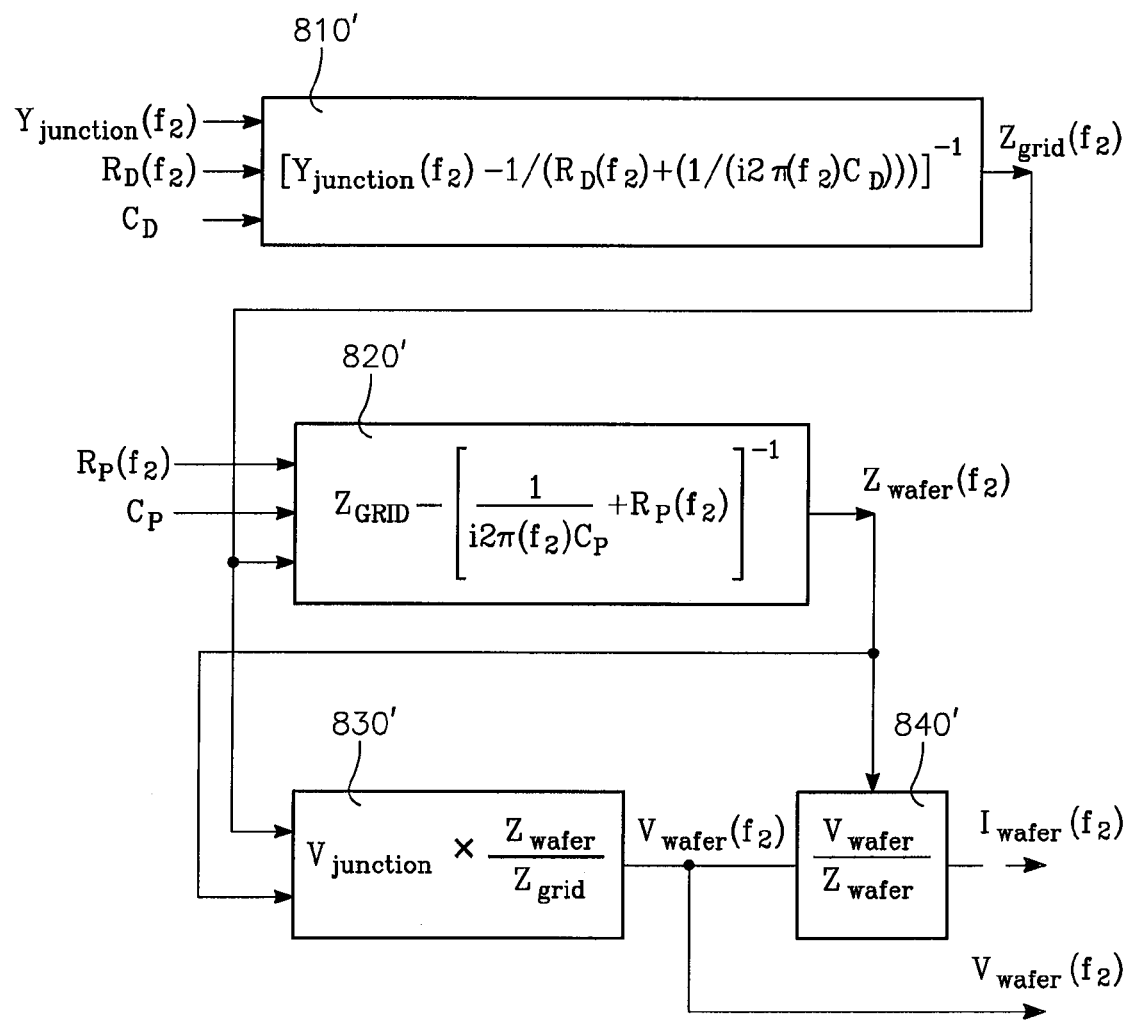
FIG. 8B illustrates a combined transformation processor in the measurement instrument HF section of FIG. 3B.

FIG. 8B illustrates the structure of the combined transformation processor 360' of FIG. 3B. The combined transformation processor 360' receives the parameters $R_D$(f2), $C_D$ from the processor 340' of FIG. 3B, receives the parameters $R_P$(f2), $C_P$ from the processor 350' of FIG. 3B and receives the parameter $Y_{junction}$ from the processor 320' of FIG. 3B. A grid impedance ALU 810' computes $Z_{grid}$ (the impedance at the grid 62) as follows:

[$Y_{junction}$(f2)−1/($R_D$(f2)+(1/(i2π(f1)$C_D$)))]$^{-1}$

A wafer impedance ALU 820' uses the output of the grid impedance ALU 810' to compute $Z_{wafer}$ (the impedance at the wafer 120 of FIG. 2) as follows:

$Z_{grid}$(f2)−1/($R_P$(f2)+(1/(i2π(f1)$C_P$)))

A wafer voltage ALU 830' uses the outputs of both ALUs 810' and 820' and $V_{junction}$(f2) from the divider 530' of FIG. 5B to compute the voltage on the wafer 40 of FIG. 2, $V_{wafer}$(f2) as $V_{junction}$(f2)$Z_{wafer}$(f2)/$Z_{grid}$(f2).

It should be noted that the exact computation of $Z_{grid}$(f2) depends upon both $V_{in}$(f2) and $I_{in}$(f2) in respective transmission line equations for the voltage and current $V_{junction}$ (f2), $I_{junction}$(f2) as described above, so that $Z_{grid}$(f2) is not necessarily a constant. In order to simplify the computation of the wafer voltage $V_{wafer}$(f2), the factor $Z_{wafer}$(f2)/$Z_{grid}$ (f2) is ignored (assigned a value of unity). Alternatively, in order to simplify the calculation, an average value of $Z_{grid}$ (f2) within an applicable operating process window may be chosen as a constant to replace the exact computation of $Z_{grid}$(f2) in the determination of $V_{wafer}$(f2). With this simplification, the factor $Z_{wafer}$(f2)/$Z_{grid}$(f2) becomes a constant, so that the determination of the wafer voltage $V_{wafer}$ (f2) by ALU 830' becomes multiplication of the cable/electrode junction voltage $V_{junction}$(f2) by a constant (i.e., by the factor $Z_{wafer}$(f2)/$Z_{grid}$(f2)). This may reduce the accuracy slightly but has the advantage of simplifying the computation of $V_{wafer}$(f2).

If desired, the wafer current at f2 may be measured by a processor 840' that divides the wafer voltage $V_{wafer}$(f2) by the wafer impedance $Z_{wafer}$(f2).

Determination of the Constants Used by the Processors of FIG. 1A:

The two measurement instrument sections 140a, 140b provide the LF and HF components of the wafer voltage $V_{wafer}$(f1), $V_{wafer}$(f2), respectively. These two components are used in the processor of FIG. 1B to compute the total wafer D.C. voltage while accounting for voltage losses due to intermodulation between the two frequencies, as described above with reference to FIG. 1B. The LF constants K1(f1), K2(f1) employed by the processor 90 of FIG. 1B to determine the LF component of the wafer voltage are defined in accordance with the disclosure of FIGS. 3A, 4A, 5A, 6A, 7A and 8A as follows:

$K1(f1)$=[$Z_{wafer}$(f1)/$Z_{grid}$(f1)] cos h [$V_{ch}$(f1)(−length)]

$K2(f1)$=[$Z_{wafer}$(f1)/$Z_{grid}$(f1)]$Z_{ch}$ sin h [$V_{ch}$(f1)(−length)]

The HF constants K1(f2), K2(f2) employed by the processor 91 of FIG. 1B to determine the HF component of the wafer voltage are defined in accordance with the disclosure of FIGS. 3B, 4B, 5B, 6B, 7B and 8B as follows:

$K1(f2)$=[$Z_{wafer}$(f2)/$Z_{grid}$(f2)] cos h [$V_{ch}$(f2)(−length)]

$K2(f2)=[Z_{wafer}(f2)/Z_{grid}(f2)]Z_{ch} \sin h [V_{ch}(f2)(-length)]$

Figure 9:
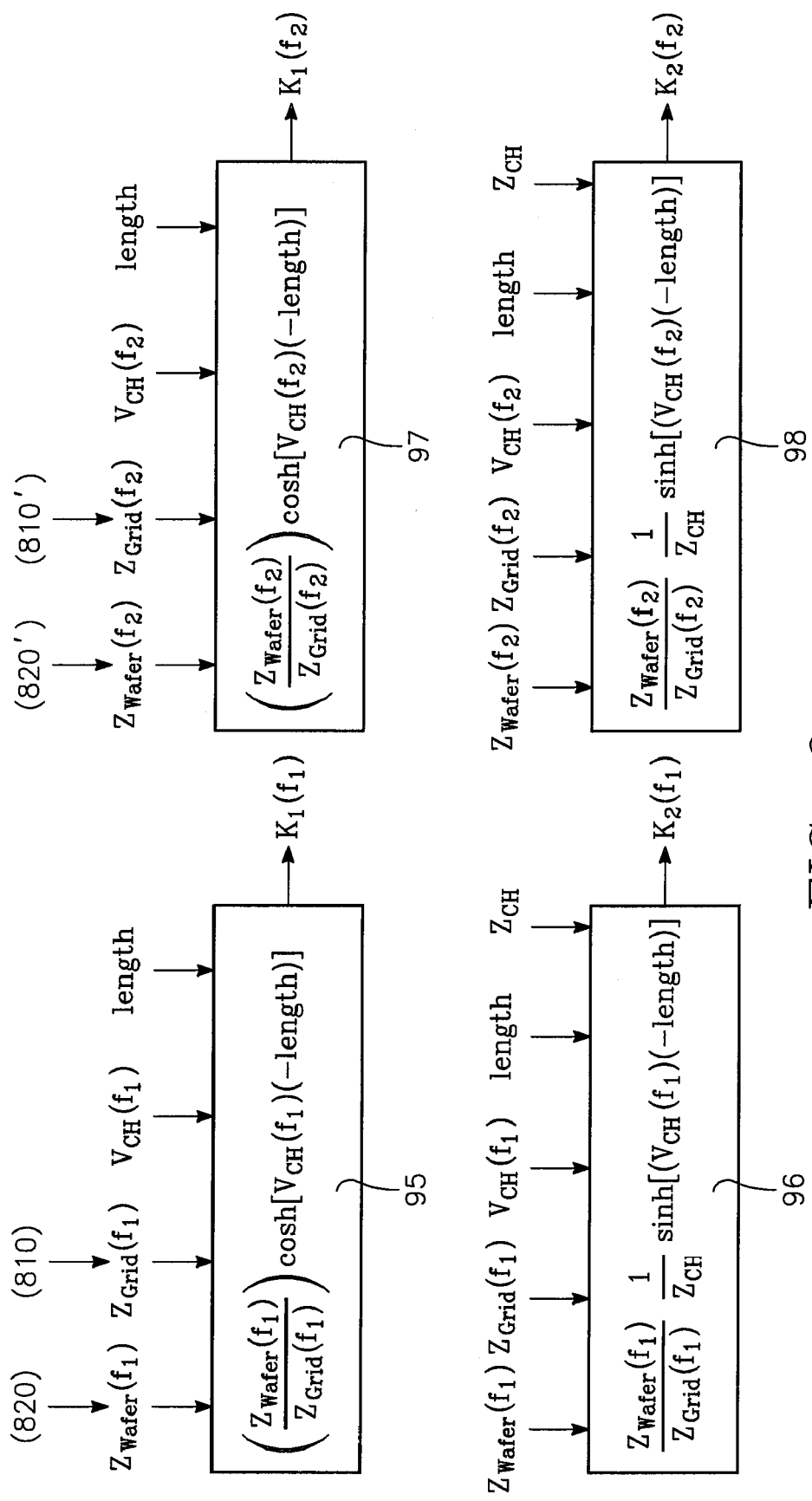
FIG. 9 illustrates apparatus for providing constants or factors employed by the measurement instrument of FIG. 1A.

FIG. 9 depicts processors 95, 96, 97, 98 for producing the constants K1(f1), K2(f1), K1(f2), K2(f2), respectively. For the processors 95 and 96, the values of $Z_{wafer}(f1)$ and $Z_{grid}(f1)$ come from the processors 820 and 810, respectively (of FIG. 8A), as indicated in FIG. 9. For the processors 97 and 98, the values of $Z_{wafer}(f2)$ and $Z_{grid}(f2)$ come from the processors 820' and 810' (of FIG. 8B) respectively, as indicated in FIG. 9. These constants may be stored in the registers 90a, 90b, 91a, 91b, respectively, of FIG. 1B.

In a highly efficient implementation, phase information from the sensor 132 is not required. In this implementation, the phase processor 310 is not employed and the sensor voltages and currents V(f1), I(f1), V(f2), I(f2) are multiplied by the constants stored in the registers 90a, 90b, 91a, 91b in the manner shown in FIG. 1B. In order to ensure that K1(f1), K2(f1), K1(f2), K2(f2) are true constants, the quantity $Z_{grid}$, is replaced by an average value of $Z_{grid}$ applicable over a predicted operating process window, as mentioned previously in this specification.

While each operation performed in the measurement instrument 140 has been described with respect to a separate processor, several of the processors within the measurement instrument 140 may be realized in a single processor whose resources are shared to perform the different operations at different times. Or, all of the processors in the measurement instrument 140 are realized by a single processor that is a shared resource among the different operations performed by the measurement instrument, so that the measurement instrument 140 may be realized as computer using a central processing unit (CPU) to perform all the operations.

The phase processors 310a, 310b transform the measured values of the voltage and current sensed by the sensor 132 into input voltages and currents $V_{in}(f1)$, $I_{in}(f1)$, $V_{in}(f2)$, $I_{in}(f2)$. For purposes of the claims below, therefore, the phase processors 310a, 310b may be considered to be part of the sensor 132, so that the outputs $V_{in}(f1)$, $I_{in}(f1)$, $V_{in}(f2)$, $I_{in}(f2)$ of the phase processors 310, 310b are considered as the measured voltages and currents from the sensor 132. In fact, in some cases it may be possible to eliminate or bypass the phase processors 310.

The use of stored constants K1(f1), K2(f1), K1(f2), K2(f2) greatly simplifies the computations of the wafer voltage frequency components by reducing them to simple multiplications of the sensed current and voltage by respective constants and summations of the resulting products. This makes it unnecessary to measure phase in order to determine the wafer voltage.

Some Advantages of the Invention:

The invention may be used with a Johnson-Raybeck electrostatic chuck (ESC) (i.e., the type of ESC depicted in FIG. 1A) in an etch process to control the wafer D.C. voltage so accurately that the bias power may be increased to the capacity of the ESC (e.g., 10 kW) at a very high wafer temperature (e.g., 60 degrees C.) for straighter etch profile at a very low chamber pressure (e.g., 5 mT) for better etch selectivity. The heat transfer from the wafer is regulated by controlling the electrostatic clamping force, as described above. Without the accurate measurement and control of the wafer D.C. voltage provided by the present invention, the risk in running such high wafer bias power is that an error in the wafer D.C. voltage may cause one of two catastrophic events: (1) if the D.C. wafer voltage is too small, the wafer may be inadequately clamped so that its temperature rises out of control or the wafer is released from the ESC; (2) if the D.C. wafer voltage is too great, the wafer may be over-clamped, leading to process failure by excessive D.C. wafer current. The problem is that, while a Johnson-Raybeck ESC can tolerate very high wafer bias power levels (e.g., 10 kW) at low chamber pressure (e.g., 5-10 mT) without breaking down, its insulator layer becomes very lossy at the high temperatures desired for etching, requiring more bias power to maintain a given D.C. wafer voltage, leading to higher wafer current. Before the invention, this problem had to be avoided by limiting the wafer temperature or the wafer bias voltage (or both) to prevent any error in the wafer D.C. voltage from exceeding the permissible limits. With the present invention, the wafer D.C. voltage (and current) is monitored in real time with great accuracy in a completely non-invasive manner. With control feedback to the bias power level, the wafer D.C. voltage and (hence) the wafer clamping voltage can be taken near the permissible limits (i.e., near maximum wafer current limits or near the minimum clamping voltage) with any violation of those limits prevented by a real time feedback control system between the invention's accurate wafer D.C. voltage measurement and the RF bias power level. As a result, the bias power can be increased to a very high level (e.g., 10 kW) at relatively low chamber pressure (e.g., 5 mT) at a high wafer temperature (e.g., 60 degrees C.). These process parameter values define a new high performance etch process window that has been unattainable until the present invention.

While the invention has been described in detail by specific reference to preferred embodiments, it is understood that variations and modifications thereof may be made without departing from the true spirit and scope of the invention.

What is claimed is:

1. In a plasma reactor having an electrostatic chuck (ESC) supporting a wafer to be processed, a method of processing the wafer while controlling an ESC clamping voltage, comprising:

applying RF bias power to said ESC from a bias power source at an input to said ESC and applying a D.C. voltage at said input to said ESC from a D.C. voltage source;

measuring voltage and current near said input to produce a measured voltage and a measured current;

providing a wafer voltage signal as a sum of said measured voltage and said measured current multiplied by first and second coefficients respectively, said wafer voltage signal representing the voltage on a wafer supported on said ESC; and computing a wafer clamping voltage as a difference between a D.C. component of said wafer voltage signal and said D.C. voltage from said D.C. voltage source, and controlling said D.C. voltage to regulate said wafer clamping voltage.

2. The method of claim 1 wherein the step of controlling said D.C. voltage comprises minimizing a difference between said wafer clamping voltage and a target clamping voltage.

3. The method of claim 2 further comprising selecting said target clamping voltage in accordance with a desired wafer temperature.

4. The method of claim 1 wherein the step of applying RF bias power comprises applying RF bias power through a coaxial transmission line, and wherein said first and second coefficients comprise a voltage coefficient and a current coefficient, respectively, of a transmission line equation corresponding to said coaxial transmission line.

5. The method of claim 4 wherein said wafer support pedestal comprises a conductive grid coupled to the output end of said coaxial transmission line, and:

the step of providing said wafer voltage signal comprises multiplying said sum by a correction factor comprising ratio between a grid-to-wafer impedance, $Z_{wafer}$, and a grid-to-ground impedance, $Z_{grid}$.

6. The method of claim 5 further comprising:

producing said voltage and current coefficients in accordance with said transmission line equation and storing said coefficients in a memory associated with said reactor;

producing said grid-to-ground impedance, $Z_{grid}$, in accordance with a grid-to-ground transformation corresponding to said transmission line and storing said grid-to-ground impedance in said memory; and producing said grid-to-wafer impedance, $Z_{wafer}$, in accordance with a grid-to-wafer transformation of said ESC, and storing said grid-to-wafer impedance in said memory.

7. In a plasma reactor having a wafer voltage controller and an electrostatic chuck (ESC) for clamping a wafer to be processed in the reactor, a method for determining a wafer voltage for use by the controller, comprising:

applying plasma RF bias power comprising first and second frequency components, $f(1)$, $f(2)$, respectively, to an input of said ESC;

providing measurement signals representing first and second frequency components of a measured voltage and first and second frequency components of a measured current at said input of said ESC;

providing first and second frequency components of a wafer voltage signal as, respectively, a first sum of the first frequency components of said measured voltage and measured current multiplied by first and second coefficients respectively, and a second sum of the second frequency components of said measured voltage and measured current multiplied by third and fourth coefficients, respectively; and computing a D.C. wafer voltage by combining D.C. components of said first and second frequency components of said wafer voltage with a correction factor comprising a product of said D.C. components of said first and second components of said wafer voltage raised to a selected power and multiplied by a selected coefficient.

8. The method of claim 7 wherein said selected power is about 0.5 and said selected coefficient is about 0.3.

9. The method of claim 7 wherein said selected power is about 0.43 and said selected coefficient is about one.

10. The method of claim 7 wherein said reactor comprises a D.C. supply voltage source connected to said ESC, said method further comprising:

controlling the voltage of said D.C. supply voltage source of said ESC to govern a wafer clamping voltage comprising a difference between said D.C. wafer voltage and the voltage of said D.C. supply voltage of said ESC.

11. The method of claim 10 wherein the step of controlling comprises minimizing a difference between said clamping voltage and a target clamping voltage.

12. The method of claim 11 further comprising selecting said target clamping voltage in accordance with a desired wafer temperature.

13. The method reactor of claim 7 wherein:

said first and second coefficients comprise a first frequency voltage coefficient and a first frequency current coefficient, respectively, of a transmission line equation corresponding to a coaxial transmission line connected to said input of said ESC; and said third and fourth coefficients comprise a second frequency voltage coefficient and a second frequency current coefficient, respectively, of a transmission line equation corresponding to said coaxial transmission line.

14. The method of claim 13 wherein the step of providing said clamping voltage further comprises:

multiplying said first sum by a correction factor comprising a ratio between a first frequency component of a grid-to-wafer impedance, $Z_{wafer}(f1)$, and a first frequency component of a grid-to-ground impedance, $Z_{grid}(f1)$;

multiplying said second sum by a correction factor comprising a ratio between a second frequency component of a grid-to-wafer impedance, $Z_{wafer}(f2)$, and a second frequency component of a grid-to-ground impedance, $Z_{grid}(f2)$.

15. The method of claim 14 further comprising:

producing said first and second frequency voltage and current coefficients in accordance with a transmission line model and storing said coefficients in a memory associated with said reactor;

producing said first and second frequency component grid-to-ground impedances, $Z_{grid}(f1)$, $Z_{grid}(f2)$, in accordance with a grid-to-ground electrical model and storing said impedances in said memory; and producing said first and second frequency component grid-to-wafer impedances, $Z_{wafer}(f1)$, $Z_{wafer}(f2)$ in accordance with a grid-to-wafer electrical model and storing said impedances in said memory.

16. The reactor of claim 7 wherein said first frequency component corresponds to a low frequency on the order of a few MHz, and said second frequency component corresponds to a high frequency on the order of about 10 MHz, and wherein said correction factor compensates for intermodulation between said first and second frequency components.

* * * * *